United States Patent
Xavier et al.

(10) Patent No.: US 11,956,340 B1
(45) Date of Patent: Apr. 9, 2024

(54) METHODS AND APPARATUS TO REDUCE RETIMER LATENCY AND JITTER

(71) Applicant: Texas Instruments Incorporated, Dallas, TX (US)

(72) Inventors: Ani Xavier, Bangalore (IN); Jagannathan Venkataraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 17/956,487

(22) Filed: Sep. 29, 2022

(51) Int. Cl.
  *H04L 7/00* (2006.01)
(52) U.S. Cl.
  CPC .................. *H04L 7/0008* (2013.01)
(58) Field of Classification Search
  CPC ..................................................... H04L 7/0008
  See application file for complete search history.

(56) References Cited

U.S. PATENT DOCUMENTS

| | | | | |
|---|---|---|---|---|
| 2002/0070783 A1* | 6/2002 | Saeki | ........................ | G06F 1/10 327/235 |
| 2006/0262891 A1* | 11/2006 | Faulkner | ............... | H03L 7/0812 375/371 |
| 2008/0056426 A1* | 3/2008 | Si | .......................... | H03L 7/0814 375/373 |
| 2021/0200256 A1* | 7/2021 | Shi | ............................ | G06F 1/12 |
| 2022/0197330 A1* | 6/2022 | Xavier | .................. | H03L 7/0818 |

* cited by examiner

*Primary Examiner* — Jaison Joseph
(74) *Attorney, Agent, or Firm* — Valerie M. Davis; Frank D. Cimino

(57) ABSTRACT

An example system includes: interleaving circuitry including a data input, a plurality of data outputs, and a plurality of clock inputs, the data input coupled to the received data input and each of the plurality of clock inputs coupled to one of the plurality of receiver clock outputs; and handoff circuitry coupled to the interleaving circuitry, the handoff circuitry including: comparison circuitry coupled to the clock generation circuitry and configured to compare the plurality of receiver clocks to the transmission clock; clock configuration circuitry coupled to the comparison circuitry and configured to select one of the plurality of receiver clocks based on the comparison circuitry; and a plurality of flip-flops coupled to the clock configuration circuitry and configured to convert the plurality of data outputs from the plurality of receiver clocks to the transmission clock to generate a plurality of transmission data streams based on the one of the plurality of receiver clocks selected by the clock configuration circuitry.

20 Claims, 12 Drawing Sheets

METHODS AND APPARATUS TO REDUCE RETIMER LATENCY AND JITTER

TECHNICAL FIELD

This description relates generally to retimers, and more particularly to methods and apparatus to reduce retimer latency and jitter.

BACKGROUND

Retimer circuitry is typically electrically coupled between transmitter circuitry and receiver circuitry along transmission lines to increase a range of data transmissions from the transmitter circuitry. Retiming data transmission reduces transmission errors, which increase as distance between the transmitter circuitry and receiver circuitry increase. Retimer circuitry receives data from the transmitter circuitry based on a first clock and converts the received data from the first clock to a second clock. Retimer circuitry transmits the converted data to the receiver circuitry using the second clock.

Retimer circuitry includes handoff circuitry and clock generation circuitry. The handoff circuitry converts the received data to data capable of transmission to the receiver circuitry. The handoff circuitry converts the received data from the first clock to the second clock. The clock generation circuitry generates the first and the second clock.

SUMMARY

For methods and apparatus to reduce retimer latency and jitter, an example system includes a received data input adapted to receive an input data stream; a data output adapted to output an output data stream; clock generation circuitry configured to generate a transmission clock at a transmission clock output and configured to generate a plurality of receiver clocks at a corresponding one of a plurality of receiver clock outputs, each of the plurality of receiver clocks having a different phase shift; interleaving circuitry including a data input, a plurality of data outputs, and a plurality of clock inputs, the data input coupled to the received data input and each of the plurality of clock inputs coupled to one of the plurality of receiver clock outputs; and handoff circuitry coupled to the interleaving circuitry, the handoff circuitry including: comparison circuitry coupled to the clock generation circuitry and configured to compare the plurality of receiver clocks to the transmission clock; clock configuration circuitry coupled to the comparison circuitry and configured to select one of the plurality of receiver clocks based on the comparison circuitry; and a plurality of flip-flops coupled to the clock configuration circuitry and configured to convert the plurality of data outputs from the plurality of receiver clocks to the transmission clock to generate a plurality of transmission data streams based on the one of the plurality of receiver clocks selected by the clock configuration circuitry.

In some examples, input data is clocked using a receiver clock (that may exhibit higher jitter). The retimer of some examples hands-off (e.g., converts) the input data clocked with the receiver clock to data that is clocked using a transmitter clock (that exhibits less jitter) and transmits the data clocked with the transmitter clock. In some examples, the retimer is operational over a wide range of frequencies. In some examples, a delay difference between the receiver clock and the transmitter clock may exceed one clock period.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
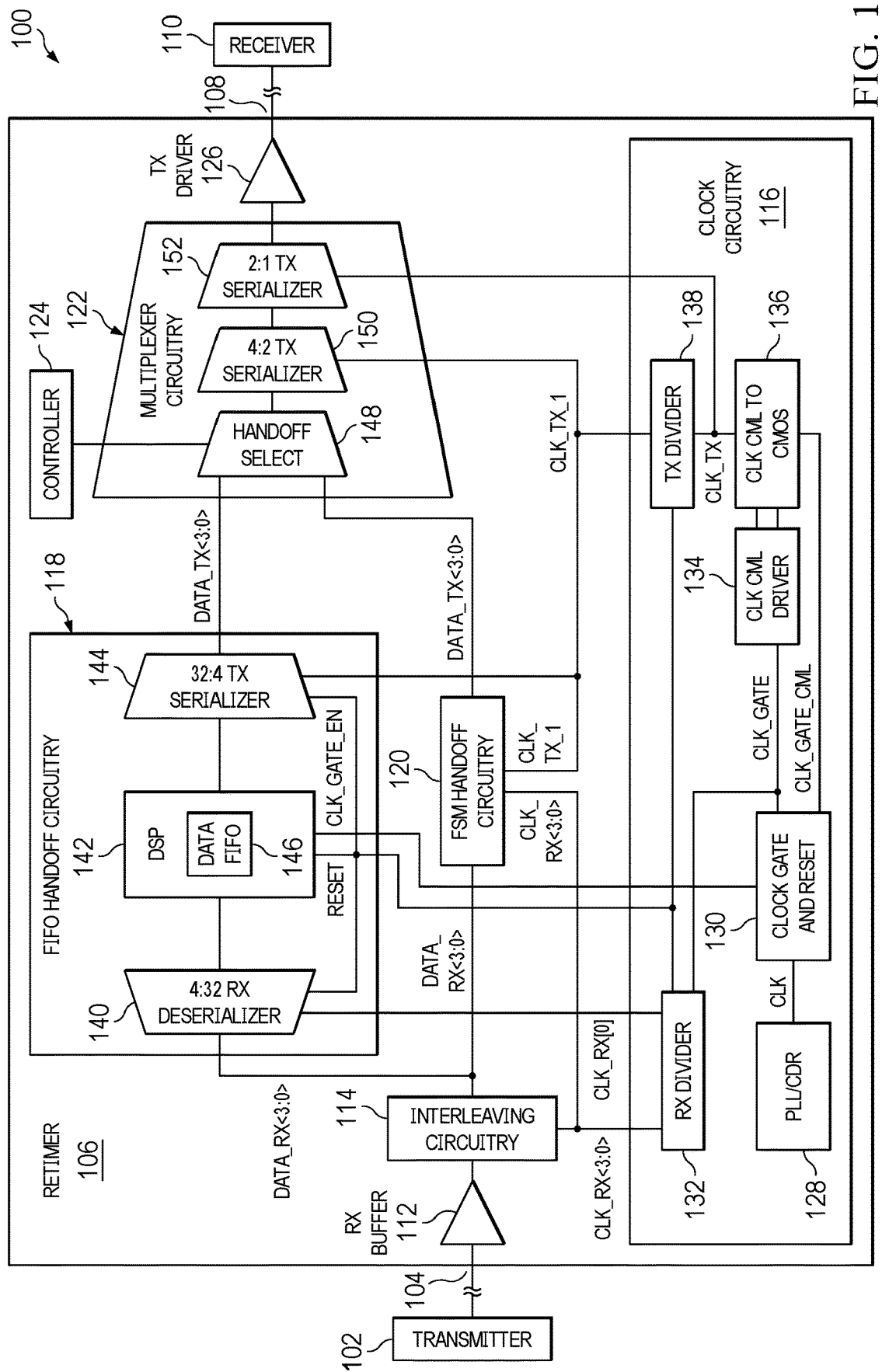
FIG. 1 is a block diagram of an example communication system including example retimer circuitry, the retimer circuitry further including example finite state machine (FSM) handoff circuitry and example first in first out (FIFO) handoff circuitry.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

To reduce transmission errors, such as jitter, retimer circuitry is typically coupled between transmitter circuitry and receiver circuitry thereby increasing a range of data transmissions from the transmitter circuitry. Transmission lines may include one or more retimers depending on the transmission distance. Retimer circuitry receives data transmissions from transmitter circuitry using a receiver clock. The retimer circuitry converts the received data based on the receiver clock to transmission data based on a transmission clock. The retimer circuitry generates the transmission data using the transmission clock and the received data, such as to remove jitter generated between the transmitter circuitry and the retimer circuitry. The retimer circuitry transmits the transmission data to the receiver circuitry.

Retimer circuitry typically includes a receiver, a data slicer, clock generation circuitry, handoff circuitry, a retimer multiplexer, and re-transmitter circuitry. The receiver is coupled to transmitter circuitry by a first transmission line (e.g., a network cable, an optical cable, electrical traces, twisted pair conductors, coaxial cable, or other single-conductor or multi-conductor transmission lines). The transmitter circuitry, coupled to the receiver, is a source of data transmissions on the first transmission line. The receiver intercepts data transmissions on the first transmission line. The receiver supplies the data slicer with the intercepted data transmissions. The data slicer slices intercepted data transmissions into two data streams of two different phases using a receiver clock, generated by the clock generation circuitry. For example, the data slicer generates two four gigahertz (GHz) data streams from an intercepted data transmission of eight gigahertz (GHz). In such an example, the two generated data streams are approximately (preferably exactly) one-hundred and eighty degrees out of phase of each other. The data slicer supplies the two data streams to the handoff circuitry.

The handoff circuitry includes a deserializer, a first in first out (FIFO) buffer, and a serializer. The deserializer deserializes the two data streams from the data slicer into sixteen data streams using the receiver clock. The handoff circuitry supplies the sixteen data streams to the FIFO buffer. The FIFO buffer supplies buffered data streams to the serializer to convert sixteen data streams into two data streams using a transmission clock, generated by the clock generation circuitry. The serializer supplies the two data streams to the retimer multiplexer. The handoff circuitry adds latency to the data transmission. The added latency corresponds to the process of deserializing down to sixteen data streams, buffering the data streams, and serializing back into two data streams.

The re-transmitter circuitry uses the transmission clock to re-transmit data transmissions. In order to minimize jitter, the clock generation circuitry may include a clock driver to generate the second clock with low jitter. The retimer serializer supplies the transmission data to the re-transmitter circuitry. The re-transmitter circuitry transmits the transmission data to the receiver circuitry. The receiver circuitry typically approximates the latency added to the data transmission by the handoff circuitry to accurately receive re-transmitted data. As transmission speeds continue to increase, retimer circuitry needs to retime data transmissions with a deterministic latency, support increasing clock speeds, be capable of removing jitter, and support retiming from asynchronous clock domains to a wide range of transmission frequencies.

The examples described herein include a method and apparatus to set a retimer latency to a deterministic value, reduce jitter, and support increasing transmission speeds using a plurality of flip-flops and a finite state machine (FSM) to retime transmissions with a relatively low data latency. In some described examples, retimer circuitry includes advanced clock generation circuitry and FSM handoff circuitry. The advanced clock generation circuitry includes clock gate and reset circuitry which deterministically handoffs data transmissions. Such a deterministic characteristic of transmission clock generation reduces uncertainty in propagation delay by creating a deterministic latency of the retimer circuitry. The advanced clock generation circuitry may be used by a FIFO buffer-based handoff circuitry and/or the FSM-based handoff circuitry to transmit data using a deterministic latency. Advantageously, the FSM-based handoff circuitry retimes data transmissions to have a latency less than the FIFO buffer-based handoff.

The FSM handoff circuitry includes comparison circuitry, a FSM, a plurality of flip-flops, and clock selection circuitry. The FSM handoff circuitry receives four receiver data streams, such that the retimer circuitry includes a data slicer capable of generating four receiver data streams of four different phases. The comparison circuitry compares four receiver clocks of different phases to the transmission clock. The comparison circuitry provides a result of the comparison to the FSM. The FSM determines which of the receiver clock phases is closest to the transmission clock based on the comparison circuitry. The FSM configures the clock selection circuitry to couple the receiver clock, selected by the FSM, to clock inputs of the plurality of flip-flops. The plurality of flip-flops convert the four receiver data streams generated by the data slicer to the transmission clock. Advantageously, the FSM handoff circuitry converts received data from four receiver clocks to the transmission clock without needing to deserialize and serialize the data streams.

FIG. 1 is a block diagram of communication system 100 including transmitter circuitry 102, a first transmission line 104, retimer circuitry 106, a second transmission line 108, and receiver circuitry 110. The communication system 100 is configured to use the transmitter circuitry 102 to transmit data to the receiver circuitry 110. The communication system 100 uses the transmission lines 104 and 108 to connect the transmitter circuitry 102 and the receiver circuitry 110. The communication system 100 includes the retimer circuitry 106 between the transmission lines 104 and 108 to reduce data transmission errors.

In the example of FIG. 1, the transmitter circuitry 102 is coupled to the retimer circuitry 106 by the first transmission line 104. The transmitter circuitry 102 transmits data using the first transmission line 104. The transmitter circuitry 102 may be implemented in connection with processor circuitry, a microcontroller unit (MCU), etc. The transmitter circuitry 102 transmits data to the retimer circuitry 106.

The retimer circuitry 106 is coupled to the receiver circuitry 110 by the second transmission line 108. In the example of FIG. 1, the retimer circuitry 106 includes a receiver buffer 112, interleaving circuitry 114, clock generation circuitry 116, FIFO handoff circuitry 118, FSM handoff circuitry 120, multiplexer circuitry 122, a controller 124, and a transmitter (TX) driver 126. The retimer circuitry 106 is configured to receive data transmissions from the transmitter circuitry 102. The retimer circuitry 106 uses the handoff circuitry 118 or 120 to handoff the received data from receiver clocks (CLK_RX<3:0>) to a divided transmission clock (CLK_TX_1) for data transmission. In other words, the handoff circuitry 118 and/or 120 converts the received data from one clocking domain, such as the receiver clock domain, to another clocking domain, such as the transmission clock domain. The retimer circuitry 106 transmits the transmission data to the receiver circuitry 110.

The receiver buffer 112 isolates the first transmission line 104 from the interleaving circuitry 114 by buffering data transmissions from the transmitter circuitry 102. The receiver buffer 112 supplies an isolated data stream, representing data transmissions from the transmitter circuitry 102, to the interleaving circuitry 114.

The interleaving circuitry 114 is coupled to the receiver buffer 112, the clock generation circuitry 116, the FIFO handoff circuitry 118, and the FSM handoff circuitry 120. The interleaving circuitry 114 converts data transmissions from the receiver buffer 112 into four receiver data streams (DATA_RX<3:0>) based on receiver clock signals (CLK_RX<3:0>). The four receiver data streams represent the data transmissions using a reduced data rate. For example, the interleaving circuitry 114 converts a thirty-two gigahertz (GHz) data transmission (such as pulse amplitude modulation 4-level (PAM4) 64 GSPS) into four, eight-gigahertz (GHz) data streams. The interleaving circuitry 114 uses one of four receiver clock signals (CLK_RX<3:0>) from clock generation circuitry 116 to generate each of the four receiver data streams. The four receiver clock signals each include a different phase shift. For example, a first receiver clock signal is an eight-gigahertz (GHz) clock signal, a second receiver clock signal is equal to the eight-gigahertz (GHz) clock signal with a ninety degree phase shift, a third receiver clock signal is equal to the eight-gigahertz (GHz) clock signal with a one-hundred and eighty degree phase shift, and a fourth receiver clock signal is equal to the eight-gigahertz (GHz) clock signal with a two-hundred and seventy degree phase shift. In such an example, the interleaving circuitry 114 generates a first data stream using the first receiver clock signal, a second data stream using the second receiver clock signal, a third data stream using the third clock signal, and a fourth data stream using the fourth clock signal. Advantageously, the interleaving circuitry 114 reduces the data rate of data transmission by converting data transmissions into four receiver data streams of a reduced data rate. The interleaving circuitry 114 supplies the four receiver data streams to the FIFO handoff circuitry 118 and the FSM handoff circuitry 120.

The clock generation circuitry 116 is coupled to the interleaving circuitry 114, the FIFO handoff circuitry 118, the FSM handoff circuitry 120, and the multiplexer circuitry 122. In the example of FIG. 1, the clock generation circuitry 116 includes a clock generator (PLL/CDR) 128, clock gate and reset circuitry 130, a receiver (RX) clock divider 132, a current mode logic (CML) driver 134, a CML-to-complementary metal-oxide semiconductor (CMOS) converter 136, and a transmitter (TX) clock divider 138. The clock generation circuitry 116 generates the four receiver clock signals for the interleaving circuitry 114 and the FSM handoff circuitry 120. The clock generation circuitry 116 generates a receiver clock signal (CLK_RX [0]) for the FIFO handoff circuitry 118. The clock generation circuitry 116 generates a transmission clock (CLK_TX) for the multiplexer circuitry 122. The clock generation circuitry 116 generates a divided transmission clock (CLK_TX_1) for the FIFO handoff circuitry 118, the FSM handoff circuitry 120, and the multiplexer circuitry 122.

The clock generator 128 is coupled to the clock gate and reset circuitry 130. The clock generator 128 generates a clock signal (CLK) of a predetermined frequency. For example, the clock generator 128 generates a sixteen-gigahertz (GHz) clock to support PAM4 64 GSPS transmissions. The clock generator 128 includes circuitry to generate a clock signal of a frequency, such as a crystal oscillator, resistor-capacitor (RC) oscillator, voltage controlled oscillator, etc. The clock generator 128 may include circuitry to modify the frequency of the clock signal, such as phase lock loop (PLL) circuitry, clock data recovery (CDR) circuitry, etc. The clock generator 128 supplies the clock signal to the clock gate and reset circuitry 130.

The clock gate and reset circuitry 130 is coupled to the FIFO handoff circuitry 118, the RX clock divider 132, the CML driver 134, and the CLM-to-CMOS converter 136. The clock gate and reset circuitry 130 generates a gated clock signal (CLK_GATE) and a clock gate CML signal (CLK_GATE_CML) based on a clock gate enable (CLK_GATE_EN) from the FIFO handoff circuitry 118 and the clock signal from the clock generator 128. The gated clock signal is a gated version of the clock signal generated by the clock generator 128. The clock gate CML signal controls operations of the CML-to-CMOS converter 136. An example of the clock gate and reset circuitry 130 is discussed further in connection with FIG. 4, below. The clock gate and reset circuitry 130 supplies the gated clock signal to the RX clock divider 132 and the CML driver 134. The clock gate and reset circuitry 130 supplies the clock gate CML signal to the CLM-to-CMOS converter 136.

The RX clock divider 132 is coupled to the interleaving circuitry 114, the FIFO handoff circuitry 118, the FSM handoff circuitry 120, and the clock gate and reset circuitry 130. The RX clock divider 132 generates the four receiver clock signals based on the gated clock signal from the clock gate and reset circuitry 130. The FIFO handoff circuitry 118 resets a state of the RX clock divider 132 by a reset signal (RESET). The reset signal causes circuitry of the RX clock divider 132, such as flip-flops, to reset to a known state (e.g., a logic high output or a logic low output). The RX clock divider 132 divides the frequency of the gated clock signal by two. For example, the four receiver clock signals are eight-gigahertz (GHz) clock signals when the gated clock signal is sixteen-gigahertz (GHz). The RX clock divider 132 generates each of the four receiver clock signals to include a different phase shift (e.g., zero degrees, ninety degrees, one-hundred and eighty degrees, two-hundred and seventy, etc.). For example, a first receiver clock signal includes a zero degrees phase shift, a second receiver clock signal includes a ninety degree phase shift, a third receiver clock signal includes a one-hundred and eighty degree phase shift, and a fourth receiver clock signal includes a two-hundred and seventy degree phase shift. The RX clock divider 132 supplies the four receiver clock signals to the interleaving circuitry 114 and the FSM handoff circuitry 120 at a corresponding one or more of a plurality of receiver clock outputs. The RX clock divider 132 supplies the receiver clock signal corresponding to a zero degree phase shift to the FIFO handoff circuitry 118.

The CML driver 134 is coupled to the clock gate and reset circuitry 130 and the CML-to-CMOS converter 136. The CML driver 134 converts the gated clock signal from the clock gate and reset circuitry 130 into a CML clock signal. CML signals are less prone to jitter compared to CMOS signals. Advantageously, the CML driver 134 reduces jitter and power consumption for transmissions (including transmission along electrical traces) greater than approximately two millimeters (mm) by converting the gated clock signal into a CML clock signal. The CML driver 134 supplies the CML clock signal to the CML-to-CMOS converter 136 at one or more of a CML output.

The CML-to-CMOS converter 136 is coupled to the multiplexer circuitry 122, the clock gate and reset circuitry 130, the CML driver 134, and the TX clock divider 138. The CML-to-CMOS converter 136 generates the transmission clock by converting the CML clock signal from the CML driver 134 to a CMOS signal. The CML-to-CMOS converter 136 holds a charge across a coupling capacitor (illustrated in FIG. 5) while the gated clock signal is disabled using the clock gate control signal from the clock gate and reset circuitry 130. Advantageously, holding the charge across the coupling capacitor reduces clock corruption caused by a discharge of the coupling capacitor while the gated clock signal is disabled. An example of the CML-to-CMOS converter 136 is discussed further in connection with FIG. 5, below. The CML-to-CMOS converter 136 supplies the transmission clock to the multiplexer circuitry 122 and the TX clock divider 138.

The TX clock divider 138 is coupled to the FIFO handoff circuitry 118, the FSM handoff circuitry 120, and the multiplexer circuitry 122. The TX clock divider 138 generates the divided transmission clock based on the transmission clock from the CML-to-CMOS converter 136 at a transmission clock output. The FIFO handoff circuitry 118 resets a state of the TX clock divider 138 by the reset signal. The reset signal to cause circuitry of the TX clock divider 138, such as flip-flops, to reset to a known state (e.g., a logic high output or a logic low output). The TX clock divider 138 divides the frequency of the transmission clock by two. For example, the divided transmission clock is eight-gigahertz (GHz) when the transmission clock is sixteen-gigahertz (GHz). The TX clock divider 138 supplies the divided transmission clock to the FIFO handoff circuitry 118, the FSM handoff circuitry 120, and the multiplexer circuitry 122.

The FIFO handoff circuitry 118 is coupled to the interleaving circuitry 114, the clock generation circuitry 116, and the multiplexer circuitry 122. In the example of FIG. 1, the FIFO handoff circuitry 118 includes deserializer circuitry 140, a digital signal processor (DSP) 142, and serializer circuitry 144. The FIFO handoff circuitry 118 converts the four receiver data streams from the interleaving circuitry 114 into four transmission data streams (DATA_TX<3:0>). The FIFO handoff circuitry 118 generates the four transmission data streams based on the divided transmission clock from the clock generation circuitry 116.

The deserializer circuitry 140 is coupled to the interleaving circuitry 114, the clock generation circuitry 116, and the DSP 142. The deserializer circuitry 140 deserializes the four receiver data streams from the interleaving circuitry 114 into thirty-two receiver data streams based on the first receiver clock from the clock generation circuitry 116. The thirty-two receiver data streams are of a data rate less than the data rate of the four receiver data streams. For example, each of the thirty-two receiver data streams include a one-gigahertz (GHz) data rate when each of the four data streams include an eight-gigahertz (GHz) data rate. The deserializer circuitry 140 supplies the thirty-two receiver data streams to the DSP 142 at a plurality of receiver data stream outputs.

The DSP 142 is coupled to the clock generation circuitry 116, the deserializer circuitry 140, and the serializer circuitry 144. In the example of FIG. 1, the DSP 142 includes a FIFO buffer 146. The DSP 142 generates the reset signal and clock gate enable signal to deterministically start the clock generation circuitry 116. For example, the DSP 142 disables the clock generation circuitry 116 by the clock gate enable signal and causes a reset operation. In such an example, after the clock gate enable signal enables the clock generation circuitry 116, circuitry comprising the clock generation circuitry 116 is in a known state, such a state is a deterministic state. The reset signal may be configured to reset the FIFO buffer 146, such as to clear data stored in the FIFO buffer 146. The operations of the reset signal and clock gate enable signal which deterministically start the clock generation circuitry 116 are described in further detail in connection with FIGS. 4 and 6, below. The DSP 142 supplies the thirty-two receiver data streams to an input of the FIFO buffer 146. The DSP 142 supplies thirty-two transmission data streams to the serializer circuitry 144. The thirty-two transmission data streams are an output of the FIFO buffer 146 at a plurality of buffered data stream outputs. The FIFO buffer 146 allows input data streams to be based on the first receiver clock signal and accessed based on the divided transmission clock. The FIFO buffer 146 may be implemented using hardware and/or software and may include a plurality of FIFO buffers.

The serializer circuitry 144 is coupled to the clock generation circuitry 116, the multiplexer circuitry 122, and the DSP 142. The serializer circuitry 144 serializes the thirty-two transmission data streams from the FIFO buffer 146 into four transmission data streams based on the divided transmission clock from the clock generation circuitry 116. The serializer circuitry 144 supplies the four transmission data streams to the multiplexer circuitry 122.

The FSM handoff circuitry 120 is coupled to the interleaving circuitry 114, the clock generation circuitry 116, and the multiplexer circuitry 122. The FSM handoff circuitry 120 converts the four receiver data streams from the interleaving circuitry 114 into four transmission data streams (DATA_TX<3:0>) based on a comparison of the four receiver clock signals to the divided transmission clock from the clock generation circuitry 116. The FSM handoff circuitry 120 configures an FSM (illustrated and discussed in FIG. 2, below) based on a comparison of each of the four receiver clock signals to the divided transmission clock. The FSM configures a plurality of flip-flops (illustrated and discussed in FIG. 2, below) to latch the four receiver data streams based on the comparison. The FSM handoff circuitry 120 is described in further detail in connection with FIGS. 2, 3A, and 3B, below. Advantageously, the FSM handoff circuitry 120 converts the four receiver data streams into four transmission data streams without reducing the data rate of the four receiver data streams, such as during the operations of the deserializer circuitry 140 of the FIFO handoff circuitry 118. The FSM handoff circuitry 120 supplies the four transmission data streams to the multiplexer circuitry 122.

The multiplexer circuitry 122 is coupled to the clock generation circuitry 116, the FIFO handoff circuitry 118, the FSM handoff circuitry 120, the controller 124, and the TX driver 126. In the example of FIG. 1, the multiplexer circuitry 122 includes a multiplexer 148, a first transmission serializer 150, and a second TX serializer 152. The multiplexer circuitry 122 generates a transmission data stream based on the four transmission data streams from the FIFO handoff circuitry 118 or the FSM handoff circuitry 120 and the first and divided transmission clocks from the clock generation circuitry 116.

The multiplexer 148 is coupled to the FIFO handoff circuitry 118, the FSM handoff circuitry 120, and the controller 124. The multiplexer 148 selectively supplies the four transmission data streams from either the FIFO handoff circuitry 118 or the FSM handoff circuitry 120 to the first transmission serializer 150. The controller 124 controls the multiplexer 148 to select one of the four transmission data streams from the FIFO handoff circuitry 118 or the FSM handoff circuitry 120 to supply to the first transmission serializer 150. The controller 124 may control the multiplexer 148 based on a type of data transmission, frequency of transmission, a result of a handshake with the transmitter circuitry 102 and/or the receiver circuitry 110, etc. For example, the controller 124 may configure the multiplexer based on a register in the DSP 142, which is set based on a received transmission indication of a type of data transmission, such as an indication of PAM4 64 GSPS transmissions. In another example, the DSP 142 may supply the FIFO buffer 146 with data, to be transmitted to the receiver circuitry 110, indicating which of the handoff circuitry 118 or 120 is to be used. In yet another example, the controller 124 may determine which of the handoff circuitry 118 or 120 is to be used based on an indication included in a data transmission from the receiver circuitry 110. Advantageously, the retimer circuitry 106 may handoff data transmissions using the FIFO handoff circuitry 118 or the FSM handoff circuitry 120.

The first transmission serializer 150 is coupled to the clock generation circuitry 116, the multiplexer 148, and the second transmission serializer 152. The first transmission serializer 150 serializes the four transmission data streams from the multiplexer 148 into two transmission data streams based on the divided transmission clock from the clock generation circuitry 116. The first transmission serializer 150 supplies the two transmission data streams to the second transmission serializer 152.

The second transmission serializer 152 is coupled to the clock generation circuitry 116, the TX driver 126, and the first transmission serializer 150. The second transmission serializer 152 serializes the two transmission data streams from the first transmission serializer 150 into the transmission data stream based on the transmission clock from the clock generation circuitry 116. The second transmission serializer 152 supplies the transmission data stream to the TX driver 126.

The TX driver 126 is coupled to the receiver circuitry 110, by the second transmission line 108, and the multiplexer circuitry 122. The TX driver 126 transmits the transmission data stream from the multiplexer circuitry 122 to the receiver circuitry 110 using the second transmission line 108. The TX driver 126 is configured to generate data transmissions capable of traversing the second transmission line 108 as an output data stream at a data output. The TX driver 126 is adapted to output the output data stream.

The receiver circuitry 110 is coupled to the retimer circuitry 106 by the second transmission line 108. The receiver circuitry 110 receives data transmissions from the retimer circuitry 106. Advantageously, data transmissions, received by the receiver circuitry 110, exhibit less jitter compared to data transmissions without the retimer circuitry 106.

Figure 2:
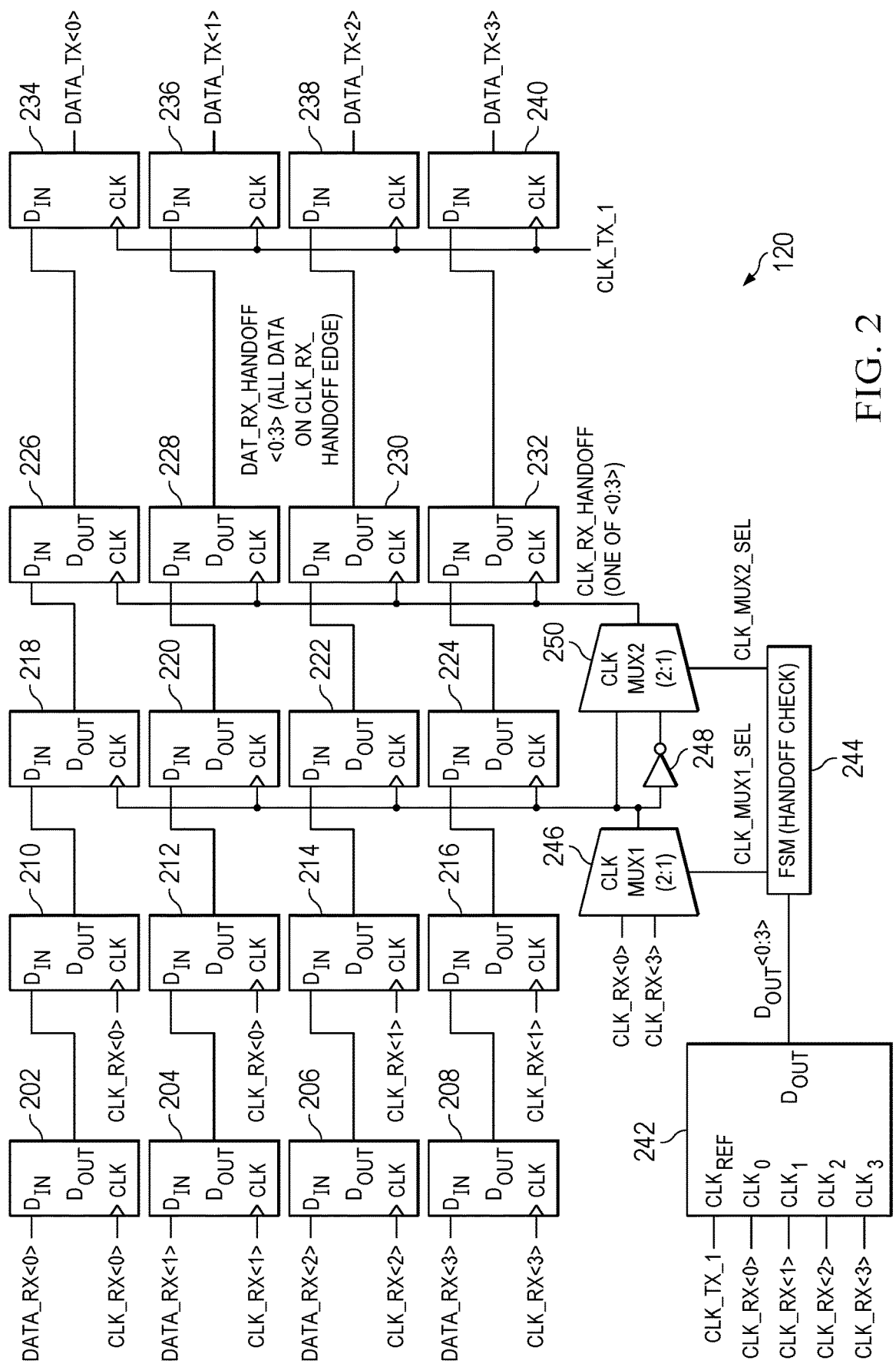
FIG. 2 is a schematic diagram of an example implementation of the FSM handoff circuitry of FIG. 1 configured to use comparison circuitry and an FSM to handoff data from the receiver clock of FIG. 1 to the transmission clock of FIG. 1.

FIG. 2 is a schematic diagram of the FSM handoff circuitry 120 of FIG. 1 configured to handoff data based on a receiver clock to data based on a transmission clock. In the example of FIG. 2, the FSM handoff circuitry 120 includes a first flip-flop 202, a second flip-flop 204, a third flip-flop 206, a fourth flip-flop 208, a fifth flip-flop 210, a sixth flip-flop 212, a seventh flip-flop 214, an eighth flip-flop 216, a ninth flip-flop 218, a tenth flip-flop 220, an eleventh flip-flop 222, a twelfth flip-flop 224, a thirteenth flip-flop 226, a fourteenth flip-flop 228, a fifteenth flip-flop 230, a sixteenth flip-flop 232, a seventeenth flip-flop 234, an eighteenth flip-flop 236, a nineteenth flip-flop 238, a twentieth flip-flop 240, comparison circuitry 242, a FSM 244, a first multiplexer 246, an inverter 248, and a second multiplexer 250. The FSM handoff circuitry 120 converts the four received data streams (DATA_RX<3:0>), generated by the interleaving circuitry 114 of FIG. 1, into the four transmission data streams (DATA_TX<3:0>). The flip-flops 202-240 are configured to latch the four received data streams based on the four receiver clocks (CLK_RX<3:0>) or the divided transmission clock (CLK_TX_1), which are generated by the clock generation circuitry 116 of FIG. 1, to generate the transmission data streams.

The flip-flops 202-208 are coupled to the interleaving circuitry 114 and the clock generation circuitry 116. The four receiver data streams, generated by the interleaving circuitry 114, are coupled to data inputs (Din) of the flip-flops 202-208. A first receiver data stream (DATA_RX<0>) is coupled to the data input of the first flip-flop 202. A second receiver data stream (DATA_RX<1>) is coupled to the data input of the second flip-flop 204. A third receiver data stream (DATA_RX<2>) is coupled to the data input of the third flip-flop 206. A fourth receiver data stream (DATA_RX<3>) is coupled to the data input of the fourth flip-flop 208.

The four receiver clocks, generated by the clock generation circuitry 116, are coupled to clock inputs (CLK) of the flip-flops 202-216. A first receiver clock (CLK_RX<0>) including a zero degree phase shift is coupled to the clock input of the flip-flops 202, 210, and 212. A second receiver clock (CLK_RX<1>) including a ninety degree phase shift is coupled to the clock input of the flip-flops 204, 214, and 216. A third receiver clock (CLK_RX<2>) including a one-hundred and eighty degree phase shift is coupled to the clock input of the third flip-flop 206. A third receiver clock (CLK_RX<3>) including a two-hundred and seventy degree phase shift is coupled to the clock input of the fourth flip-flop 208.

Data outputs (Dout) of the flip-flops 202-208 are coupled to data inputs of the flip-flops 210-216, respectively. The data output of the first flip-flop 202 is coupled to the data input of the fifth flip-flop 210. The data output of the second flip-flop 204 is coupled to the data input of the sixth flip-flop 212. The data output of the third flip-flop 206 is coupled to the data input of the seventh flip-flop 214. The data output of the fourth flip-flop 208 is coupled to the data input of the eighth flip-flop 216.

Data outputs of the flip-flops 210-216 are coupled to data inputs of the flip-flops 218-224, respectively. The data output of the fifth flip-flop 210 is coupled to the data input of the ninth flip-flop 218. The data output of the sixth flip-flop 212 is coupled to the data input of the tenth flip-flop 220. The data output of the seventh flip-flop 214 is coupled to the data input of the eleventh flip-flop 222. The data output of the eighth flip-flop 216 is coupled to the data input of the twelfth flip-flop 224. Clock inputs of the flip-flops 218-228 are coupled to the first multiplexer 246.

Data outputs of the flip-flops 218-224 are coupled to data inputs of the flip-flops 226-232, respectively. The data output of the ninth flip-flop 218 is coupled to the data input of the thirteenth flip-flop 226. The data output of the tenth flip-flop 220 is coupled to the data input of the fourteenth flip-flop 228. The data output of the eleventh flip-flop 222 is coupled to the data input of the fifteenth flip-flop 230. The data output of the twelfth flip-flop 224 is coupled to the data input of the sixteenth flip-flop 232. Clock inputs of the flip-flops 226-232 are coupled to the second multiplexer 250.

Data outputs of the flip-flops 226-232 are coupled to data inputs of the flip-flops 234-240, respectively. The data output of the thirteenth flip-flop 226 is coupled to the data input of the seventeenth flip-flop 234. The data output of the fourteenth flip-flop 228 is coupled to the data input of the eighteenth flip-flop 236. The data output of the fifteenth flip-flop 230 is coupled to the data input of the nineteenth flip-flop 238. The data output of the sixteenth flip-flop 232 is coupled to the data input of the twentieth flip-flop 240. Clock inputs of the flip-flops 234-240 are coupled to the divided transmission clock (CLK_TX_1), generated by clock generation circuitry 116.

Data outputs of the flip-flops 234-240 are the four transmission data streams (DATA_TX<3:0>) generated by the FSM handoff circuitry 120. The data output of the seventeenth flip-flop 234 is a first transmission data stream (DATA_TX<0>) of the four transmission data streams. The data output of the eighteenth flip-flop 236 is a second transmission data stream (DATA_TX<1>) of the four transmission data streams. The data output of the nineteenth flip-flop 238 is a third transmission data stream (DATA_TX<2>) of the four transmission data streams. The data output of the twentieth flip-flop 240 is a fourth transmission data stream (DATA_TX<3>) of the four transmission data streams.

The comparison circuitry 242 is coupled to the clock generation circuitry 116 and the FSM 244. The comparison circuitry 242 includes a reference clock input (CLKREF), a first clock input (CLK0), a second clock input (CLK1), a third clock input (CLK2), a fourth clock input (CLK3), and a data output (DOUT<3:0>). The reference clock input is coupled to the divided transmission clock, generated by the clock generation circuitry 116. The first clock input is coupled to the first receiver clock, generated by the clock generation circuitry 116, including a zero degree phase shift. The second clock input is coupled to the second receiver clock, generated by the clock generation circuitry 116, including a ninety degree phase shift. The third clock input is coupled to the third receiver clock, generated by the clock generation circuitry 116, including a one-hundred and eighty degree phase shift. The fourth clock input is coupled to the fourth receiver clock, generated by the clock generation circuitry 116, including a two-hundred and seventy degree phase shift. The data output is coupled to the FSM 244.

The comparison circuitry 242 is configured to compare each of the clock inputs to the reference clock input. The comparison circuitry 242 sets a bit of the data output based on the comparison of each clock input. For example, a first bit of the data output is a logic one (e.g., a "1" or logic high value) when the reference clock input is a logic high during a rising edge of the first clock input, and a second bit of the data output is a logic zero (e.g., a "0" or logic low value) when the reference clock input is a logic low during a rising edge of the second clock input. Transitions between bits of the data output indicate a rising edge or a falling edge of the reference clock occurs between certain phases shifts. For example, the falling edge of the divided transmission clock is between a zero degree and a ninety degree phase shift if the first bit of the data output is a logic high and the second bit of the data output is a logic low. The comparison circuitry 242 is further discussed in connection with FIGS. 3A and 3B, below. The comparison circuitry 242 supplies the data output to the FSM 244.

The FSM 244 is coupled to the comparison circuitry 242 and the multiplexers 246 and 250. The FSM 244 controls the multiplexers 246 and 250 based on the data output of the comparison circuitry 242. The FSM 244 may be referred to as clock configuration circuitry and may be implemented using hardware (e.g., digital circuitry, a processor, logic circuitry and/or memory) and/or software. The FSM 244 determines a phase shift which corresponds to an optimal margin when captured by a flip-flop running on the divided transmission clock. The phase shift is determined based on the data output from the comparison circuitry 242. The optimal margin is one of the four receiver clock signals whose rising edge is nearest to a falling edge of the divided transmission clock. For example, the FSM 244 determines the receiver clock with a ninety degree phase shift provides the optimal margin in response to a data output from the comparison circuitry 242 being two logic ones, corresponding to zero degree and ninety degree phase shifts, followed by two logic zeros, corresponding to one-hundred and eighty degrees and two-hundred and seventy degree phase shifts. An illustrative example of the determination of the optimal margin is discussed in further detail in connection with FIGS. 3A and 3B below.

The FSM 244 determines whether to couple the first receiver clock or the fourth receiver clock to the clock inputs of the flip-flops 218-224 based on the phase shift corresponding to the optimal margin. In the example of FIG. 2, the FSM 244 selects a phase handoff to be one of a zero degree handoff, a ninety degree handoff, a one-hundred and eighty degree handoff, or a two-hundred and seventy degree handoff. The FSM 244 configures the multiplexers 246 and 250 based on the selected phase handoff. Alternatively, the FSM handoff circuitry 120 may be configured to select between any plurality of phase handoffs of any degree of phase shift.

In the case of a zero degree handoff, the FSM 244 configures the first multiplexer 246 to supply the first receiver clock, corresponding to a zero degree phase shift, to the clock inputs of the flip-flops 218-224. The FSM 244 configures the second multiplexer 250 to supply the first receiver clock, corresponding to a zero degree phase shift, to the clock inputs of the flip-flops 226-232.

In the case of a ninety degree handoff, the FSM 244 configures the first multiplexer 246 to supply the fourth receiver clock, corresponding to a two-hundred and seventy degree phase shift, to the clock inputs of the flip-flops 218-224. The FSM 244 configures the second multiplexer 250 to supply the second receiver clock, corresponding to a ninety degree phase shift, to the clock inputs of the flip-flops 226-232.

In the case of a one-hundred and eighty degree handoff, the FSM 244 configures the first multiplexer 246 to supply the first receiver clock, corresponding to a zero degree phase shift, to the clock inputs of the flip-flops 218-224. The FSM 244 configures the second multiplexer 250 to supply the third receiver clock, corresponding to a one-hundred and eighty degree phase shift, to the clock inputs of the flip-flops 226-232.

In the case of a two-hundred and seventy degree handoff, the FSM 244 configures the first multiplexer 246 to supply the fourth receiver clock, corresponding to a two-hundred and seventy degree phase shift, to the clock inputs of the flip-flops 218-224. The FSM 244 configures the second multiplexer 250 to supply the fourth receiver clock, corresponding to a two-hundred and seventy degree phase shift, to the clock inputs of the flip-flops 226-232.

The first multiplexer 246 is coupled to the clock generation circuitry 116, the flip-flops 218-224, the FSM 244, the inverter 248, and the second multiplexer 250. The first multiplexer 246 couples one of the first or fourth receiver clocks to the flip-flops 218-224, the inverter 248, and the second multiplexer 250 based on the FSM 244.

The inverter 248 is coupled between the multiplexers 246 and 250. The inverter 248 inverts an output of the first multiplexer 246 to supply the second multiplexer 250 with an inverted version of the output of the first multiplexer 246. The inverted versions of the output of the first multiplexer 246 correspond to one-hundred and eighty degree phase shifts of the output of the first multiplexer 246. For example, the inverter 248 supplies the second multiplexer 250 with the second receiver clock, corresponding to a ninety degree phase shift, when the output of the first multiplexer 246 is the fourth receiver clock, corresponding to a two-hundred and seventy degree phase shift. In another example, the inverter 248 supplies the second multiplexer 250 with the third receiver clock, corresponding to a one-hundred and eighty degree phase shift, when the output of the first multiplexer 246 is the first receiver clock, corresponding to a zero degree phase shift.

The second multiplexer 250 is coupled to the flip-flops 226-232, the FSM 244, the first multiplexer 246, and the inverter 248. The second multiplexer 250 couples one of the four receiver clocks to the flip-flops 226-232 based on the FSM 244 and the first multiplexer 246.

In an example operation, the four receiver data streams are individually latched by the flip-flops 202-208 based on the clock signal corresponding to each streams phase shift. The latched receiver data streams corresponding to a zero degree and a ninety degree phase shift are latched by the flip-flops 210 and 212 based on the receiver clock which includes a zero degree phase shift. The latched receiver data streams corresponding to one-hundred and eighty degree and two-hundred and seventy degree phase shifts are latched by the flip-flops 214 and 216 based on the receiver clock which includes a ninety degree phase shift.

The receiver data streams latched by the flip-flops 210-216 are supplied to the flip-flops 218-224 to be latched by the receiver clock corresponding to a zero degree or a two-hundred and seventy degree phase shift based on the FSM 244. The receiver data streams latched by the flip-flops 218-224 are supplied to the flip-flops 226-232 to be latched by the receiver clock corresponding to the phase shift selected by the first multiplexer 246 of a one-hundred and eighty degree phase shift of the output of the first multiplexer 246. The receiver data streams latched by the flip-flops 226-232 are phase shifted data streams. The receiver data streams latched by the flip-flops 226-232 are supplied to the flip-flops 234-240 to be latched based on the divided transmission clock, supplied by the clock generation circuitry 116.

Figure 3A:
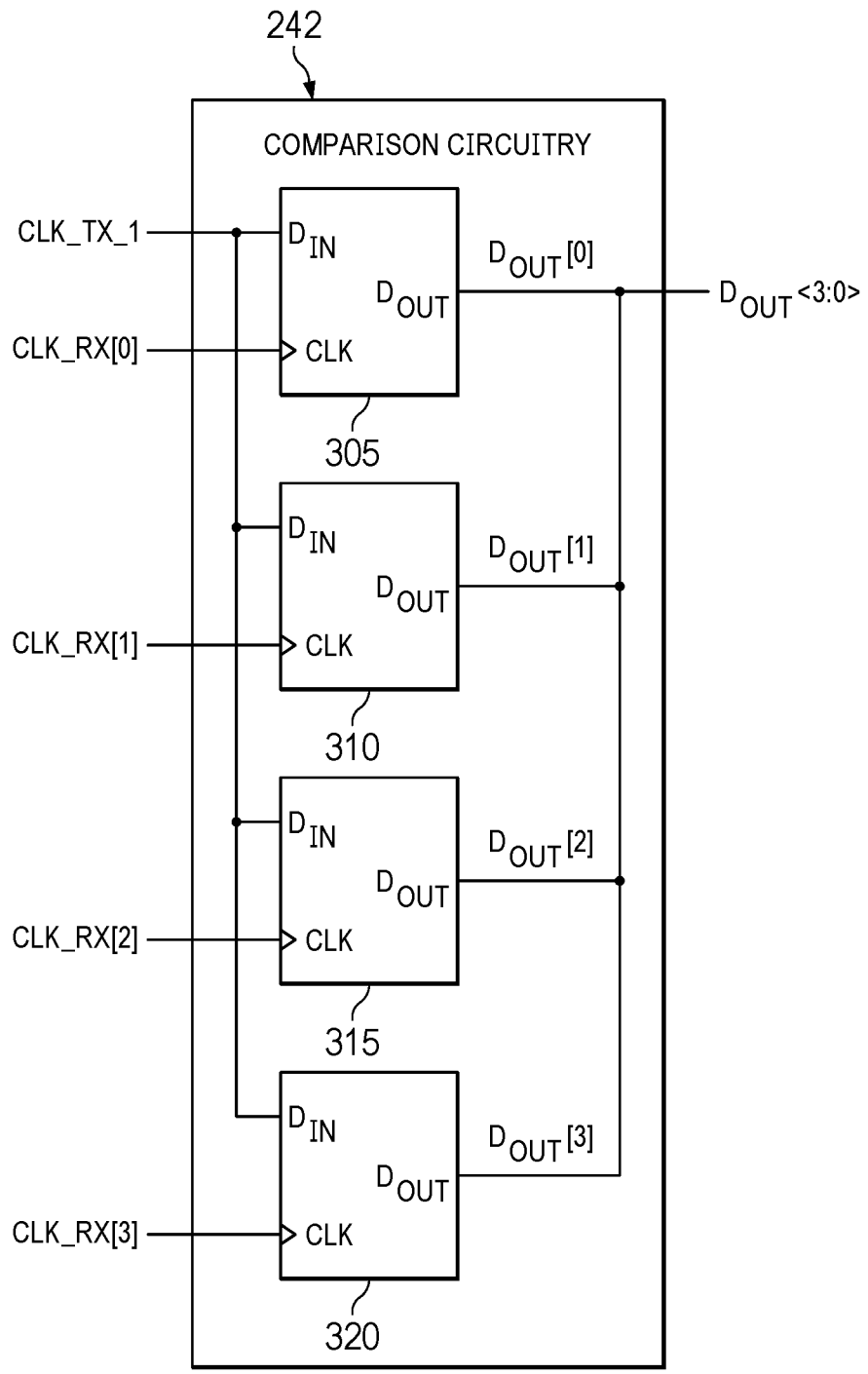
FIG. 3A is a schematic diagram of an example implementation of the comparison circuitry of FIG. 2 configured to compare four receiver clocks to a divided transmission clock.

FIG. 3A is a schematic diagram of an example implementation of the comparison circuitry 242 of FIG. 2 configured to compare the four receiver clocks (CLK_RX<3:0>), generated by the clock generation circuitry 116 of FIG. 1, to the divided transmission clock (CLK_TX_1), generated by the clock generation circuitry 116. In the example of FIG. 3A, the comparison circuitry 242 includes a first flip-flop 305, a second flip-flop 310, a third flip-flop 315, and a fourth flip-flop 320. The comparison circuitry 242 is configured to compare each of the four receiver clocks to the divided transmission clock by latching a value (e.g., a logic high or a logic low) of the divided transmission clock at a rising of each of the four receiver clocks. The comparison circuitry 242 supplies the FSM 244 of FIG. 2 with the data output (DOUT<3:0>) including a bit for each value of the divided transmission clock latched by the four receiver clocks.

In the example of FIG. 3A, the flip-flops 305-320 are configured to be coupled to the clock generation circuitry 116 and the FSM 244. Data inputs (DIN) of the flip-flops 305-320 are coupled to the divided transmission clock, generated by the clock generation circuitry 116. Clock inputs (CLK) of the flip-flops 305-320 are configured to be individually coupled to one of the four receiver clocks. Data outputs (DOUT) of the flip-flops 305-320 are configured to be coupled the FSM 244. Such data outputs of the flip-flops 305-320 may be referred to as a data output (DOUT<3:0>) of the comparison circuitry 242.

Figure 3B:
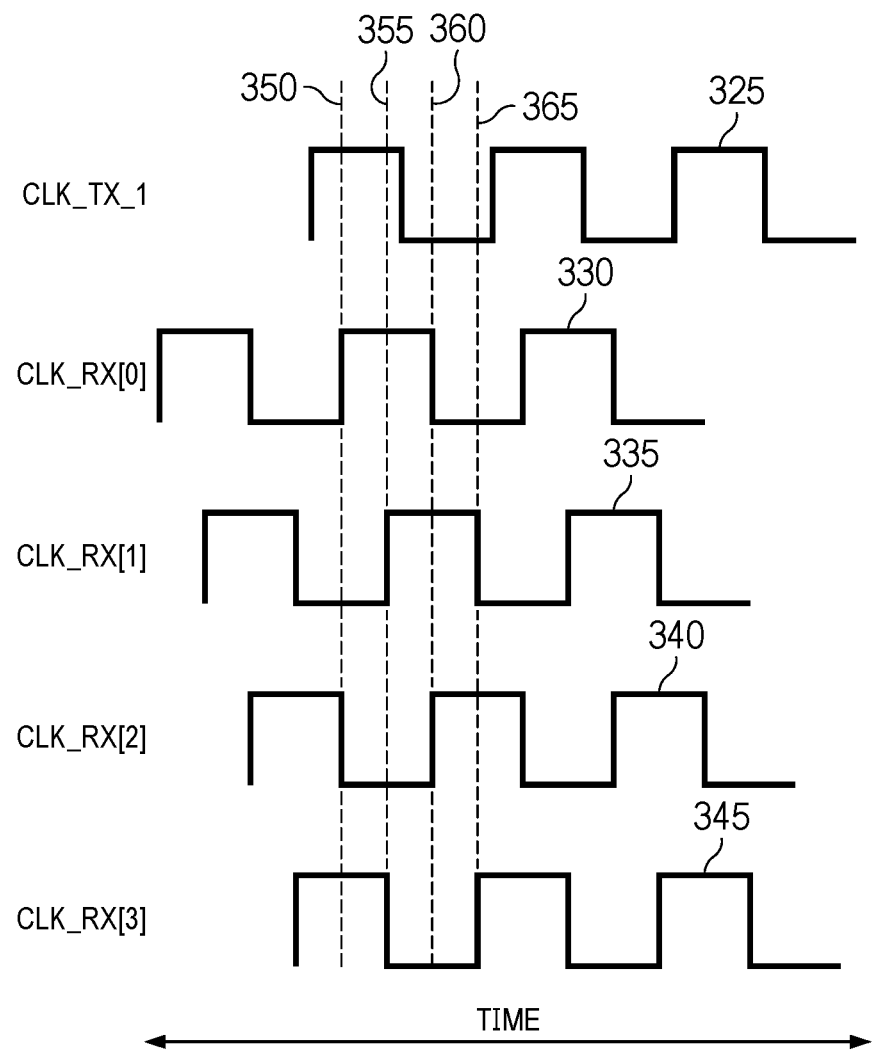
FIG. 3B is a timing diagram of an example operation of the comparison circuitry of FIGS. 2 and 3A.

FIG. 3B is a timing diagram of an example operation of the comparison circuitry 242 of FIGS. 2 and 3A. In the example of FIG. 3B, the timing diagram illustrates the divided transmission clock (CLK_TX_1) 325, the first receiver clock (CLK_RX<0>) 330, the second receiver clock (CLK_RX<1>) 335, the third receiver clock (CLK_RX<2>) 340, and the fourth receiver clock (CLK_RX<3>) 345. The divided transmission clock 325 and the receiver clocks 330-345 are generated by the clock generation circuitry 116.

The clock input of the first flip-flop 305 is coupled to the first receiver clock 330, which includes a zero degree phase shift. The first flip-flop 305 latches the value of the divided transmission clock 325 at the rising edge of the first receiver clock 330. For example, at a first time 350, a rising edge of the first receiver clock 330 causes the first flip-flop 305 to latch a logic high in response to the divided transmission clock 325 being a logic high. In such an example, a first bit of the data output of the comparison circuitry 242 is set to a logical one.

The clock input of the second flip-flop 310 is coupled to the second receiver clock 335, which includes a ninety degree phase shift. The second flip-flop 310 latches the value of the divided transmission clock 325 at the rising edge of the second receiver clock 335. For example, at a second time 355, a rising edge of the second receiver clock 335 causes the second flip-flop 310 to latch a logic high in response to the divided transmission clock 325 being a logic high. In such an example, a second bit of the data output of the comparison circuitry 242 is set to a logical one.

The clock input of the third flip-flop 315 is coupled to the third receiver clock 340, which includes a one-hundred and eighty degree phase shift. The third flip-flop 315 latches the value of the divided transmission clock 325 at the rising edge of the third receiver clock 340. For example, at a third time 360, a rising edge of the third receiver clock 340 causes the third flip-flop 315 to latch a logic low in response to the divided transmission clock 325 being a logic low. In such an example, a third bit of the data output of the comparison circuitry 242 is set to a logical zero.

The clock input of the fourth flip-flop 320 is coupled to the fourth receiver clock 345, which includes a two-hundred and seventy degree phase shift. The fourth flip-flop 320 latches the value of the divided transmission clock 325 at the rising edge of the fourth receiver clock 345. For example, at a fourth time 365, a rising edge of the fourth receiver clock 345 causes the fourth flip-flop 320 to latch a logic low in response to the divided transmission clock 325 being a logic low. In such an example, a fourth bit of the data output of the comparison circuitry 242 is set to a logical zero.

In the example of FIG. 3B, the FSM 244 determines that the second receiver clock 335 is of an optimal margin in comparison to the divided transmission clock 325. The FSM 244 determines that the transition from a logical one to a logical zero between the times 355 and 360 is representative of a falling edge of the divided transmission clock 325 and a rising edge of the second receiver clock 335. The data output of the comparison circuitry 242 after the fourth time 365 causes the FSM 244 to select a ninety degree handoff, which is described in further detail in connection with FIG. 2, above.

Figure 4:
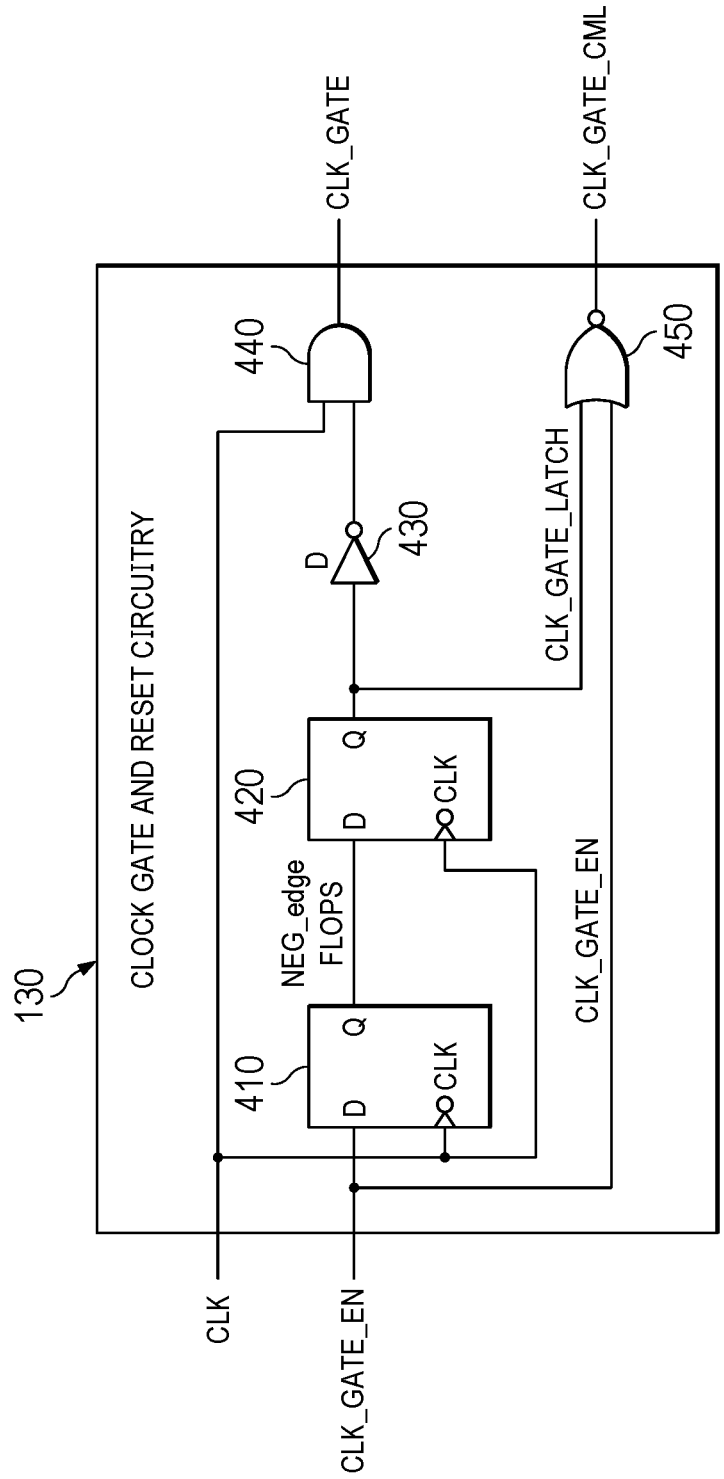
FIG. 4 is a schematic diagram of example clock gate and reset circuitry configured to generate a gated clock signal and a clock gate CML signal to generate the receiver clock of FIGS. 1, 2, 3A, and 3B and the divided transmission clock with a deterministic latency.

FIG. 4 is a schematic diagram of the clock gate and reset circuitry 130 of FIG. 1 configured to generate the gated clock signal (CLK_GATE) of FIG. 2 and the clock gate CML signal (CLK_GATE_CML) of FIG. 2. In the example of FIG. 4, the clock gate and reset circuitry 130 includes a first flip-flop 410, a second flip-flop 420, an inverter 430, an AND gate 440, and a NOR gate 450. The clock gate and reset circuitry 130 generates the gated clock signal based on the clock (CLK) of FIG. 1 generated by the clock generator 128 of FIG. 1 and the clock gate enable (CLK_GATE_EN) of FIG. 1 generated by the DSP 142 of FIG. 1. The clock gate and reset circuitry 130 generates the clock gate CML signal based on the clock gate enable and a latched clock gate enable (CLK_GATE_LATCH), generated by the flip-flops 410 and 420.

In the example of FIG. 4, the first flip-flop 410 is coupled to the DSP 142, the clock generator 128, and the second flip-flop 420. A clock input (CLK) of the first flip-flop 410 is coupled to the clock generated by the clock generator 128. A data input (D) of the first flip-flop 410 is coupled to the clock gate enable signal, generated by the DSP 142. Alternatively, the clock gate enable signal may be generated by the controller 124 of FIG. 1. An output (Q) of the first flip-flop 410 is coupled to the second flip-flop 420. The first flip-flop 410 latches the data input when a falling edge is detected on the clock input. The first flip-flop 410 is a D flip-flop. Alternatively, with slight modifications to the clock gate and reset circuitry 130 the first flip-flop 410 may be replaced with a set/reset (SR) latch, a JK flip-flop, a T flip-flop, etc.

The second flip-flop 420 is coupled to the clock generator 128, the first flip-flop 410, the inverter 430, and the NOR gate 450. A clock input (CLK) of the second flip-flop 420 is coupled to the clock generated by the clock generator 128. A data input (D) of the second flip-flop 420 is coupled to the output of the first flip-flop 410. An output (Q) of the second flip-flop 420 is coupled to the inverter 430 and the NOR gate 450. The output of the second flip-flop 420 may be referred to as a latched clock gate enable. The second flip-flop 420 latches the data input when a falling edge is detected on the clock input. The second flip-flop 420 is a D flip-flop. Alternatively, with slight modifications to the clock gate and reset circuitry 130 the second flip-flop 420 may be replaced with a set/reset (SR) latch, a JK flip-flop, a T flip-flop, etc.

The inverter 430 is coupled to the second flip-flop 420 and the AND gate 440. The inverter 430 inverts the output of the second flip-flop 420. The inverter 430 supplies the inverted output of the second flip-flop 420 to the AND gate 440. The AND gate 440 is coupled to the clock generator 128, the RX clock divider 132 of FIG. 1, the CML driver 134 of FIG. 1, and the inverter 430. The AND gate 440 generates the gated clock signal based on a logic AND of the inverted output of the second flip-flop 420 and the clock generated by the clock generator 128. The AND gate 440 supplies the gated clock signal to the RX clock divider 132 and the CML driver 134 by a gated clock output. The inverter 430 and the AND gate 440 may be illustrated as an AND gate with an inverting input.

The NOR gate 450 is coupled to the CML-to-CMOS converter 136 of FIG. 1, the DSP 142, and the second flip-flop 420. The NOR gate 450 generates the clock gate CML signal based on a logic NOR of the clock gate enable and the latched clock gate enable. The NOR gate 450 supplies the clock gate CML signal to the CML-to-CMOS converter 136.

Figure 5:
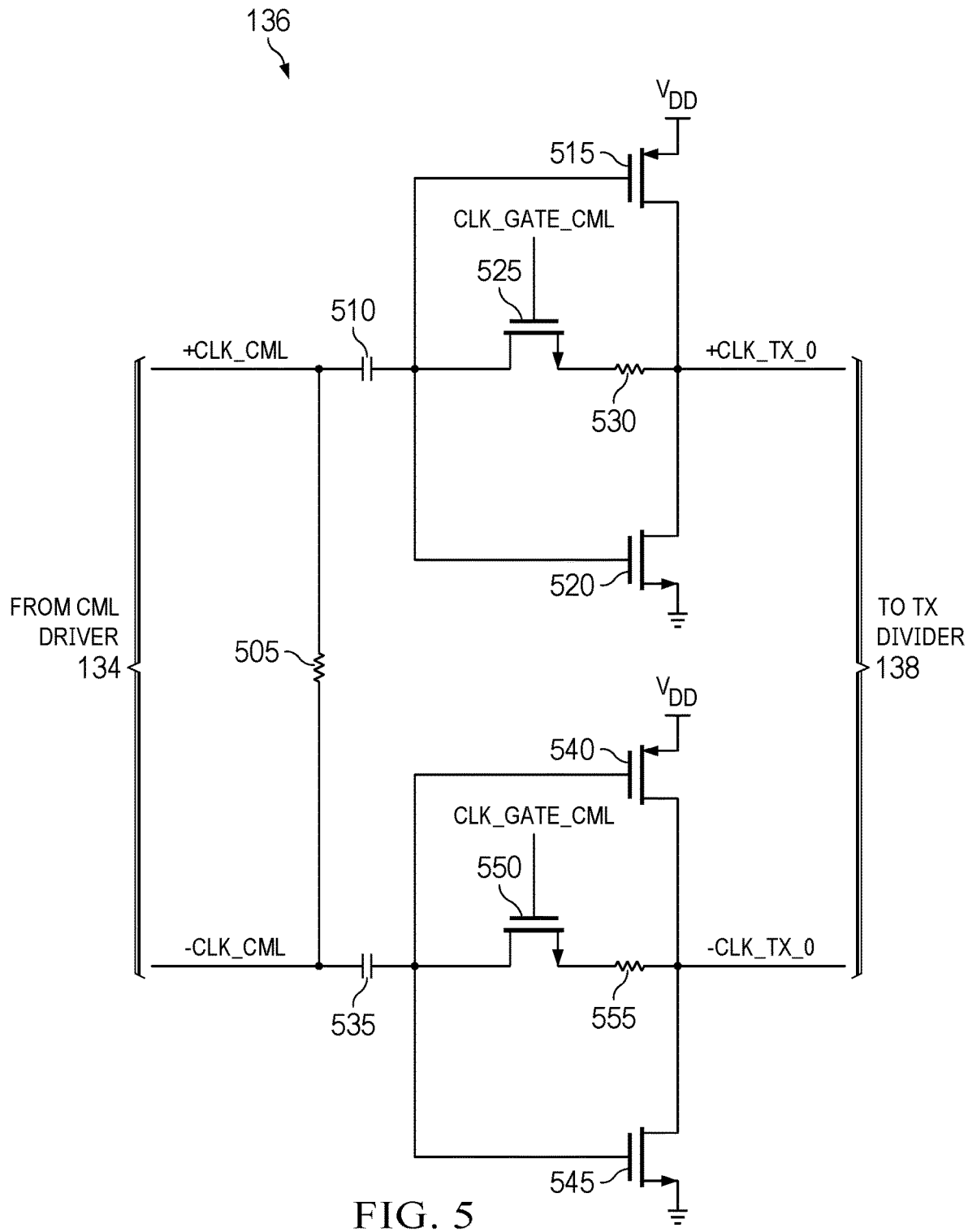
FIG. 5 is a schematic diagram of an example implementation of a CML-to-CMOS converter configured generate the transmission clock of FIG. 1 with a deterministic latency based on the clock gate CML signal of FIG. 4.

FIG. 5 is a schematic diagram of an example implementation of the CML-to-CMOS converter 136 of FIG. 1 configured to prevent discharging while the clock gate enable (CLK_GATE_EN) of FIGS. 1 and 4 is disabled. In the example of FIG. 5, the CML-to-CMOS converter 136 includes a first resistor 505, a first capacitor 510, a first transistor 515, a second transistor 520, a third transistor 525, a second resistor 530, a second capacitor 535, a fourth transistor 540, a fifth transistor 545, a sixth transistor 550, and a third resistor 555. The CML-to-CMOS converter 136 is coupled to the CML driver 134 of FIG. 1 and the TX clock divider 138 of FIG. 1. The CML-to-CMOS converter 136 is configured to convert a CML clock signal (CLK_CML) (shown in FIG. 5 as a differential signal) generated by the CML driver 134 into the transmission clock (CLK_TX_0) (shown in FIG. 5 as a differential signal) supplied to the TX clock divider 138.

The first resistor 505 is coupled between the CML driver 134 and the capacitors 510 and 535. The first resistor 505 may be coupled across transmission lines between the CML driver 134 and the first resistor 505. The first resistor 505 is coupled across the CML clock signal from the CML driver 134.

The first capacitor 510 is coupled to the CML driver 134, the first resistor 530, and the transistors 515-525. The first capacitor 510 reduces alternating current (AC) coupling between the CML driver 134 and the transistors 515-525.

The first transistor 515 is coupled to a voltage supply (VDD), the TX clock divider 138, the first capacitor 510, the second transistor 520, and the second resistor 530. The first transistor 515 is controlled by the first capacitor 510. The first transistor 515 allows current to flow from the voltage supply to the TX clock divider 138 and the second transistor 520 when turned on (e.g., conducting). The first transistor 515 prevents current from flowing from the voltage supply to the TX clock divider 138 and the second transistor 520 when turned off (e.g., not conducting). The first transistor 515 is a P-channel metal-oxide semiconductor field effect transistor (pMOSFET). Alternatively, the first transistor 515 may be an PNP bipolar junction transistor (BJT), an N-channel field-effect transistor (FET), an N-channel insulated-gate bipolar transistor (IGBT), an N-channel junction field effect transistor (JFET), N-channel MOSFET, a P-channel FET, a P-channel IGBT, a P-channel JFET, or an NPN BJT.

The second transistor 520 is coupled to a common potential (e.g., ground), the TX clock divider 138, the first capacitor 510, the first transistor 515, and the second resistor 530.

The second transistor 520 is controlled by the first capacitor 510. The second transistor 520 allows current to flow from the TX clock divider 138 and the first transistor 515 to common potential when turned on (e.g., conducting). The second transistor 520 prevents current from flowing from the TX clock divider 138 and the second transistor 520 to the common potential when turned off (e.g., not conducting). The second transistor 520 is a N-channel MOSFET (nMOSFET). Alternatively, the second transistor 520 may be an PNP BJT, an N-channel FET, an N-channel IGBT, an N-channel JFET, P-channel MOSFET, a P-channel FET, a P-channel IGBT, a P-channel JFET, or an NPN BJT.

The third transistor 525 is coupled to the clock gate and reset circuitry 130 of FIG. 1, the first capacitor 510, the transistors 515 and 520, and the second resistor 530. The third transistor 525 is controlled by the clock gate CML signal (CLK_GATE_CML), generated by the clock gate and reset circuitry 130. The third transistor 525 allows current to flow from the first capacitor 510 to the second resistor 530 when turned on (e.g., conducting). The third transistor 525 prevents current from flowing from first capacitor 510 to the second resistor 530 when turned off (e.g., not conducting). Advantageously, the third transistor 525 prevents the first capacitor 510 from discharging when turned off. The third transistor 525 is a N-channel MOSFET. Alternatively, the third transistor 525 may be an PNP BJT, an N-channel FET, an N-channel IGBT, an N-channel JFET, P-channel MOSFET, a P-channel FET, a P-channel IGBT, a P-channel JFET, or an NPN BJT.

The second resistor 530 is coupled to the TX clock divider 138 and the transistors 515-525. The second resistor 530 generates a potential difference between drains of the transistors 515 and 520 and the first capacitor 510.

The second capacitor 535 is coupled to the CML driver 134, the first resistor 530, and the transistors 540-550. The second capacitor 535 reduces AC coupling between the CML driver 134 and the transistors 540-550.

The fourth transistor 540 is coupled to the voltage supply, the TX clock divider 138, the second capacitor 535, the fifth transistor 545, and the third resistor 555. The fourth transistor 540 is controlled by the second capacitor 535. The fourth transistor 540 allows current to flow from the voltage supply to the TX clock divider 138 and the fifth transistor 545 when turned on (e.g., conducting). The fourth transistor 540 prevents current from flowing from the voltage supply to the TX clock divider 138 and the fifth transistor 545 when turned off (e.g., not conducting). The fourth transistor 540 is a P-channel MOSFET. Alternatively, the fourth transistor 540 may be an PNP BJT, an N-channel FET, an N-channel IGBT, an N-channel JFET, N-channel MOSFET, a P-channel FET, a P-channel IGBT, a P-channel JFET, or an NPN BJT.

The fifth transistor 545 is coupled to the common potential, the TX clock divider 138, the second capacitor 535, the fourth transistor 540, and the third resistor 555. The fifth transistor 545 is controlled by the second capacitor 535. The fifth transistor 545 allows current to flow from the TX clock divider 138 and the fourth transistor 540 to common potential when turned on (e.g., conducting). The fifth transistor 545 prevents current from flowing from the TX clock divider 138 and the fifth transistor 545 to the common potential when turned off (e.g., not conducting). The fifth transistor 545 is a N-channel MOSFET. Alternatively, the fifth transistor 545 may be an PNP BJT, an N-channel FET, an N-channel IGBT, an N-channel JFET, P-channel MOSFET, a P-channel FET, a P-channel IGBT, a P-channel JFET, or an NPN BJT.

The sixth transistor 550 is coupled to the clock gate and reset circuitry 130 of FIG. 1, the second capacitor 535, the transistors 540 and 545, and the third resistor 555. The sixth transistor 550 is controlled by the clock gate CML signal (CLK_GATE_CML), generated by the clock gate and reset circuitry 130. The sixth transistor 550 allows current to flow from the second capacitor 535 to the third resistor 555 when turned on (e.g., conducting). The sixth transistor 550 prevents current from flowing from second capacitor 535 to the third resistor 555 when turned off (e.g., not conducting). Advantageously, the sixth transistor 550 prevents the second capacitor 535 from discharging when turned off. The sixth transistor 550 is a N-channel MOSFET. Alternatively, the sixth transistor 550 may be an PNP BJT, an N-channel FET, an N-channel IGBT, an N-channel JFET, P-channel MOSFET, a P-channel FET, a P-channel IGBT, a P-channel JFET, or an NPN BJT.

The third resistor 555 is coupled to the TX clock divider 138 and the transistors 540-550. The third resistor 555 generates a potential difference between drains of the transistors 540 and 545 and the second capacitor 535.

An example operation of the CML-to-CMOS converter 136 is illustrated and discussed in further detail in connection with FIG. 7, below.

Figure 6:
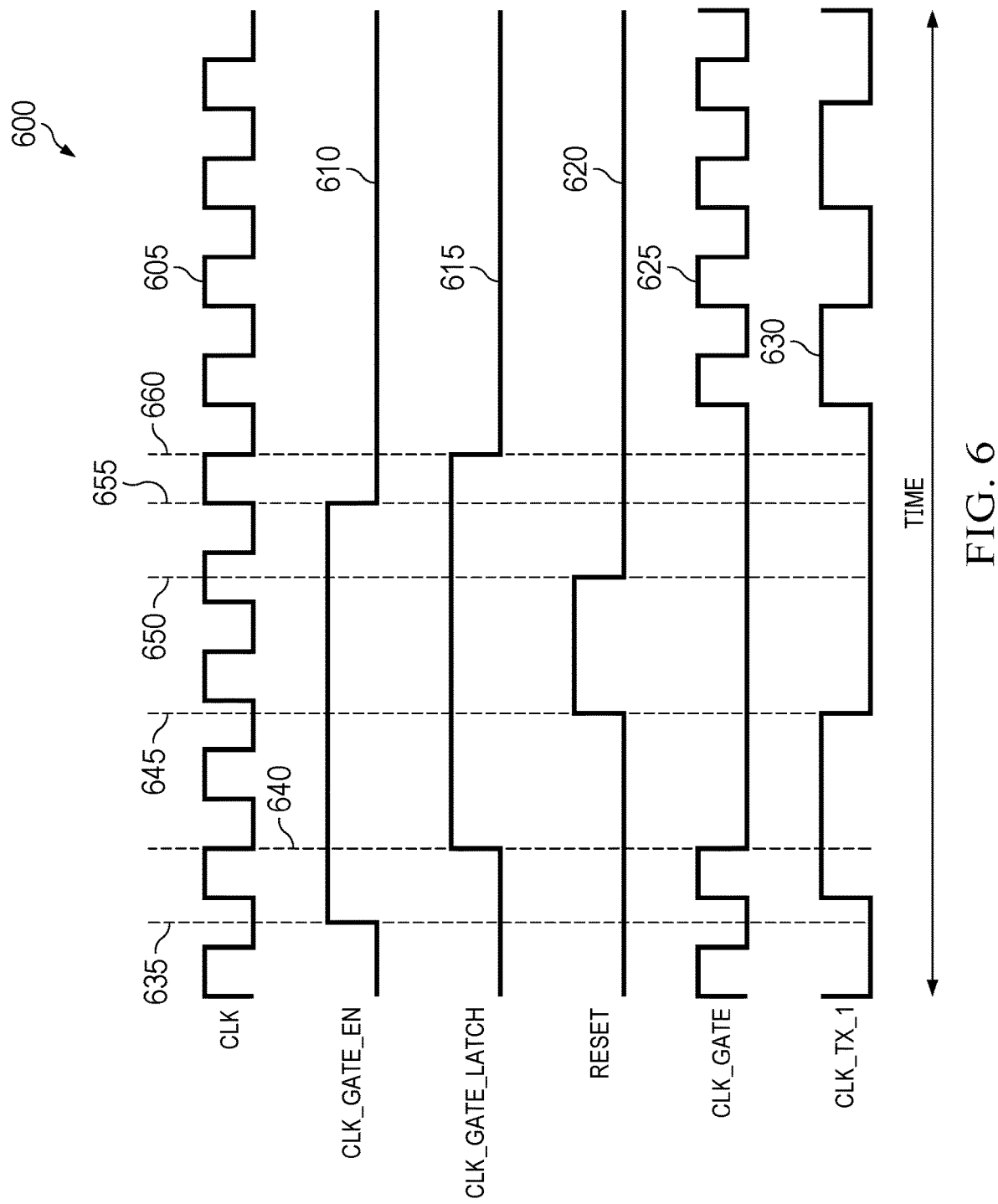
FIG. 6 a timing diagram of example operation of the clock gate and reset circuitry of FIG. 4 configured to deterministically start clock divider circuitry and the CML-to-CMOS converter of FIG. 5.

FIG. 6 is an example timing diagram 600 of example operation of the clock gate and reset circuitry 130 of FIGS. 1 and 4 configured to illustrate deterministically starting the clock dividers 132 and 138 of FIG. 1. In the example of FIG. 6, the timing diagram 600 illustrates a clock signal (CLK) 605, a clock gate enable signal (CLK_GATE_EN) 610, a clock gate latch signal (CLK_GATE_LATCH) 615, a reset signal (RESET) 620, a gated clock signal (CLK_GATE) 625, and a divided transmission clock signal (CLK_TX_1) 630.

The clock signal 605 illustrates the clock generated by the clock generator 128 of FIG. 1 and supplied to the clock gate and reset circuitry 130. The clock signal may be generated as discussed above in connection with the clock generator 128 of FIG. 1. The clock gate enable signal 610 illustrates the clock gate enable generated by the DSP 142 of FIG. 1 and supplied to the clock gate and reset circuitry 130. The clock gate latch signal 615 illustrates the output of the second flip-flop 420 of FIG. 4 and supplied to the inverter 430 of FIG. 4. The reset signal 620 illustrates the reset signal generated by the DSP 142 and supplied to the clock dividers 132 and 138 of FIG. 1. The gated clock signal 625 illustrates the gated clock generated by the AND gate 440 of FIG. 4 of the clock gate and reset circuitry 130 and supplied to the RX clock divider 132 and the CML driver 134 of FIG. 1. The divided transmission clock signal 630 illustrates the divided transmission clock generated by the TX clock divider 138 and supplied to the FIFO handoff circuitry 118 of FIG. 1, the FSM handoff circuitry 120 of FIG. 1, and the multiplexer circuitry 122 of FIG. 1.

At a first time 635, the DSP 142 sets the clock gate enable signal 610 to a logic high to disable the clock gate and reset circuitry 130. At a second time 640, the clock gate latch signal 615 transitions to a logic high in response to the flip-flops 410 and 420 of FIG. 4 latching the logic high transition of the clock gate enable signal 610, at the first time 635. At the second time 640, the output of the inverter 430 transitions to a logic low, which prevents the AND gate 440 from being a logic high. At the second time 640, the clock gate latch signal 615 disables the gated clock signal 625. At the second time 640, the divided transmission clock signal 630 is held until a rising edge of the gated clock signal 625.

At a third time 645, the DSP 142 sets the reset signal 620 to a logic high. At the third time 645, the divided transmission clock signal 630 transitions to a logic low in response to the reset signal 620 being set. Such a transition by the divided transmission clock signal 630 at the third time is in response to the TX clock divider 138 being reset. For example, a flip-flop included in the TX clock divider 138 may clear a data output in response to the reset signal being a logic high. At a fourth time 650, the DSP 142 sets the reset signal 620 to a logic low.

The operations of the reset signal 620 between the times 645 and 650 generates a pulse. The pulse propagates through the clock dividers 132 and 138 to clear clocks being generated by the clock dividers 132 and 138. Advantageously, the pulse between the times 645 and 650 enables the retimer circuitry 106 to determine the state of the clocks being generated by the clock generation circuitry 116.

At a fifth time 655, the DSP 142 sets the clock gate enable signal 610 to a logic low. At a sixth time 660, the clock gate latch signal 615 transitions to a logic low in response to the flip-flops 410 and 420 latching the logic low clock gate enable signal 610. At the sixth time 660, the gated clock signal 625 resumes following the clock signal 605 in response to the clock gate latch signal 615 being a logic low. At the sixth time 660, the divided transmission clock signal 630 resumes operations by waiting for the next rising edge of the clock signal 605. Advantageously, at the sixth time 660 operations of the clock generation circuitry 116 are deterministic as the retimer circuitry 106 leaves a reset operation.

Figure 7:
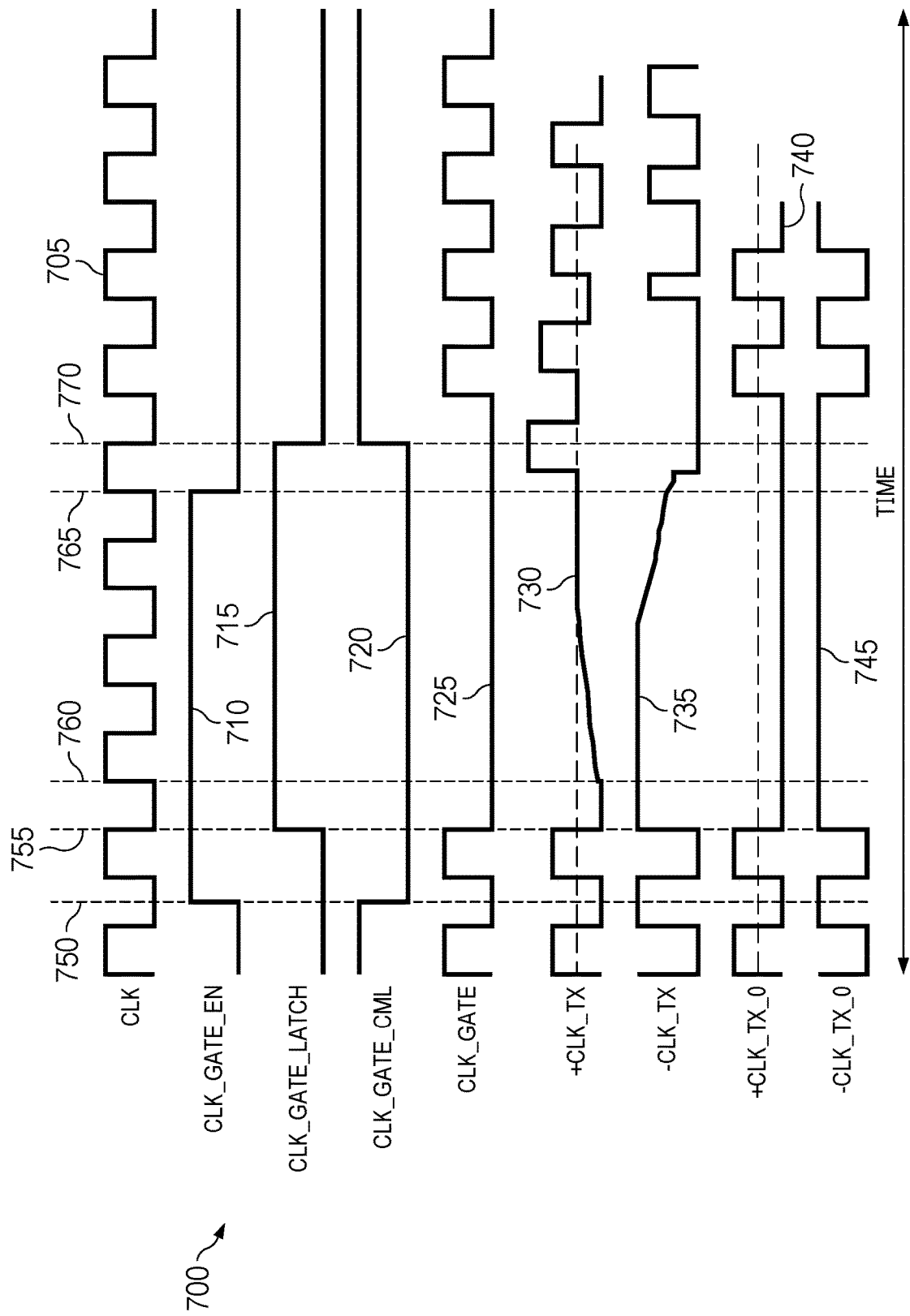
FIG. 7 is a timing diagram of example operation of the clock gate and reset circuitry of FIG. 4 and the CML-to-CMOS converter of FIG. 5 including a reduction in clock corruption of the transmission clock.

FIG. 7 is an example timing diagram 700 of example operation of the clock gate and reset circuitry 130 of FIGS. 1 and 4 and the CML-to-CMOS converter 136 of FIGS. 1 and 5 including a reduction in clock corruption of the transmission clock (CLK_TX_0). In the example of FIG. 7, the timing diagram 700 illustrates a clock signal (CLK) 705, a clock gate enable signal (CLK_GATE_EN) 710, a clock gate latch signal (CLK_GATE_LATCH) 715, a clock gate CML signal (CLK_GATE_CML) 720, a gated clock signal (CLK_GATE) 725, a fist conventional transmission clock signal (+CLK_TX) 730, a second conventional transmission clock signal (−CLK_TX) 735, a first transmission clock signal (+CLK_TX_0) 740, and a second transmission clock signal (−CLK_TX_0) 745.

The clock signal 705 illustrates the clock generated by the clock generator 128 of FIG. 1 and supplied to the clock gate and reset circuitry 130. The clock gate enable signal 710 illustrates the clock gate enable generated by the DSP 142 of FIG. 1 and supplied to the clock gate and reset circuitry 130. The clock gate latch signal 715 illustrates the output of the second flip-flop 420 of FIG. 4 and supplied to the inverter 430 of FIG. 4. The clock gate CML signal 720 illustrates the clock gate CML enable generated by the NOR gate 450 of FIG. 4 and supplied to the transistors 525 and 550 of FIG. 5. The gated clock signal 725 illustrates the gated clock generated by the AND gate 440 of FIG. 4 of the clock gate and reset circuitry 130 and supplied to the RX clock divider 132 and the CML driver 134 of FIG. 1. The conventional transmission clock signals 730 and 735 illustrate the transmission clock generated by the CML-to-CMOS converter 136 when the transistors 525 and 550 are always turned on, such as if transistors 525 and 550 were replaced with a wire or shorted. The transmission clock signals 740 and 745 illustrate the transmission clock generated by the CML-to-CMOS converter 136 of FIGS. 1 and 5 and supplied to the multiplexer circuitry 122 of FIG. 1 and the TX clock divider 138 of FIG. 1.

At a first time 750, the DSP 142 sets the clock gate enable signal 710 to a logic high. At the first time 750, the NOR gate 450 sets the clock gate CML signal 720 to a logic low in response to the clock gate enable signal 710 being a logic low. At a second time 755, the clock gate latch signal 715 transitions to a logic high in response to the flip-flops 410 and 420 of FIG. 4 latching the logic high transition of the clock gate enable signal 710, at the first time 750. At the second time 755, the output of the inverter 430 transitions to a logic low, which prevents the AND gate 440 from being a logic high. At the second time 755, the clock gate latch signal 715 disables the gated clock signal 725. At the second time 755, the transmission clock signals 730-745 are configured to be held until a rising edge of the gated clock signal 725.

At a third time 760, the capacitors 510 and 535 of FIG. 5 start to discharge causing the conventional transmission clock signals 730 and 735 to change voltages, such a change may be referred to as drift. At the third time 760, current begins to flow from the charged capacitors 510 and 535 into the resistors 530 and 555 in response to the transistors 525 and 550 not being turned off by the clock gate CML signal 720. Advantageously, voltages of the transmission clock signals 740 and 745 are held in response to the clock gate CML signal 720 turning off the transistors 525 and 550, such as to prevent the capacitors 510 and 535 from discharging.

At a fourth time 765, the DSP 142 sets the clock gate enable signal 710 to a logic low. At the fourth time 765, the conventional transmission clock signals 730 and 735 resume operations from a modified reference voltage. The conventional transmission clock signals 730 and 735 exhibit clock corruption in response to the discharge of the capacitors 510 and 535 between the times 755 and 765. Such clock corruption includes voltage shifts, inconsistent rising edges, drifts in frequency, etc. At a fifth time 770, the clock gate latch signal 715 transitions to a logic low in response to the flip-flops 410 and 420 latching the logic low clock gate enable signal 710. At the fifth time 770, the gated clock signal 725 resumes to follow the clock signal 705 in response to the clock gate latch signal 715 being a logic low. At the fifth time 770, the transmission clock signals 740 and 745 resumes operations by waiting for the next rising edge of the clock signal 705. Advantageously, the transmission clock signals 740 and 745 are not corrupted between the times 755 and 770. Advantageously, the transmission clock signals 740 and 745 resume operation in a deterministic state.

Figure 8:
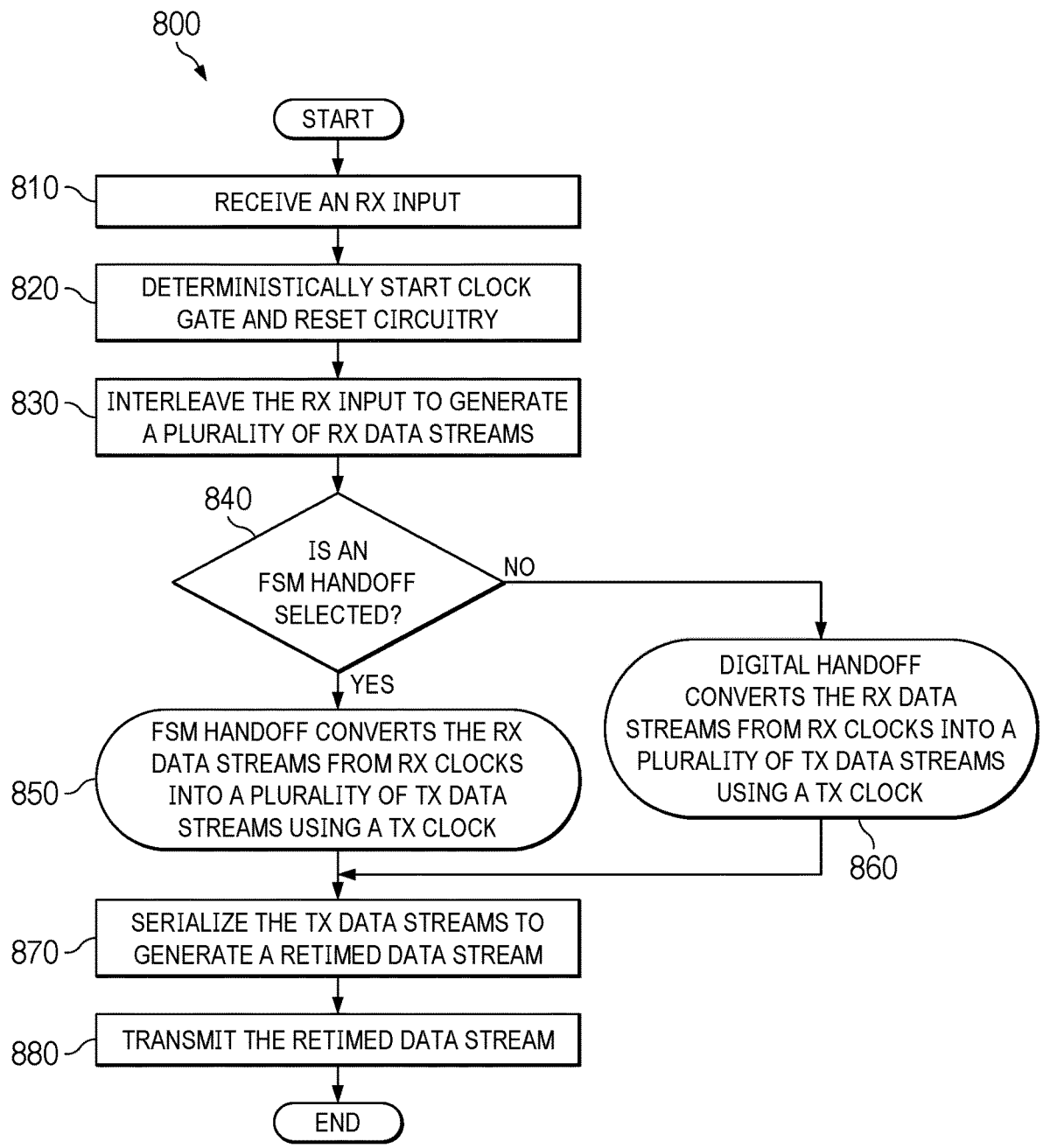
FIG. 8 is a flowchart representative of an example method that may be performed using machine readable instructions that can be executed and/or hardware configured to implement the retimer circuitry of FIG. 1.

FIG. 8 is a flowchart representative of an example method 800 that may be performed using machine readable instructions that can be executed and/or hardware (e.g., logic circuitry, analog circuitry, a processor, a state machine, memory and/or a combination thereof) configured to implement the retimer circuitry 106 of FIG. 1. The method 800 begins at block 810. At block 810, the retimer circuitry 106 receives a receiver input. The receiver input is a transmission from the transmitter circuitry 102 of FIG. 1. For example, the receiver buffer 112 of FIG. 1 receives a PAM 4 sixty-four GSPS data stream at thirty-two gigahertz (GHz) from the transmitter circuitry 102. Additionally, at block 810 the retimer circuitry 106 may acquire a frequency of the data stream from the transmitter circuitry 102. For example, the retimer circuitry 106 may perform a handshake with the transmitter circuitry 102 to determine the frequency of the data stream. The method 800 proceeds to block 820.

At block 820, the retimer circuitry 106 deterministically starts the clock gate and reset circuitry 130 of FIG. 1. For example, the DSP 142 of FIG. 1 asserts the clock gate enable signal 610 of FIG. 6 at the first time 635 of FIG. 6 followed by the reset signal 620 of FIG. 6 at the third time 645 of FIG. 6. In such an example, the DSP 142 of FIG. 1 de-asserts the reset signal 620 at the fourth time 650 of FIG. 6 to generate a pulse which resets the clock dividers 132 and 138 of FIG. 1 to a known state. The method 800 proceeds to block 830.

At block 830, the interleaving circuitry 114 of FIG. 1 interleaves the receiver input to generate a plurality of receiver data streams. For example, the interleaving circuitry 114 generates four receiver data streams (DATA_RX<3:0>) based on the receiver input from the receiver buffer 112 and four receiver clocks (CLK_RX<3:0>). In such an example, the four receiver data streams include a phase shift from one of the four receiver clocks. In other examples, the received data stream may be interleaved into any number of data streams with a corresponding number of clocks/clock phases being generated by retimer 106. The method 800 proceeds to block 840.

At block 840, the retimer circuitry 106 determines if an FSM handoff is to be used to handoff the receiver input, as described above in reference to FIG. 1 and the controller 124 of FIG. 1. For example, the FIFO handoff circuitry 118 of FIG. 1 and/or the FSM handoff circuitry 120 of FIG. 1 converts the four receiver data streams from being timed based on the four receiver clocks into four transmission data streams (DATA_TX<3:0>) timed based on a divided transmission clock (CLK_TX_1). In such an example, the controller 124 configures the multiplexer 148 of FIG. 1 to couple the four transmission data streams generated by FIFO handoff circuitry 118 or the FSM handoff circuitry 120 to the first transmission serializer 150 of FIG. 1. The method 800 proceeds to block 850 when the FSM handoff circuitry 120 is to be used to handoff the receiver input. The method 800 proceeds to block 860 when the FSM handoff circuitry 120 is not to be used to handoff the receiver input.

At block 850, the FSM handoff circuitry 120 converts the receiver data streams from being based on the receiver clocks into four transmission data streams using a transmission clock. For example, the FSM handoff circuitry 120 compares the four receiver clocks to the transmission clock using comparison circuitry 242 of FIGS. 2 and 3A to select a phase shift handoff closest to the divided transmission clock. In such an example, the FSM 244 of FIG. 2 couples one or more of the four receiver clocks to the flip-flops 218-232 of FIG. 2 to handoff the four receiver data streams to the flip-flops 234-240 of FIG. 2 which latch data inputs based on the divided transmission clock. The FSM handoff of block 850 is discussed in further detail in connection with FIG. 9, below. The method 800 proceeds to block 870.

At block 860, the FIFO handoff circuitry 118 converts the receiver data streams from being based on the receiver clocks into four transmission data streams using a transmission clock. For example, the FIFO handoff circuitry 118 deserializes the four receiver data streams, supplies the deserialized data streams to an input of the FIFO buffer 146 of FIG. 1, and serializes an output of the FIFO buffer 146 using a divided transmission clock. The FIFO handoff of block 860 is discussed in further detail in connection with FIG. 10, below. The method 800 proceeds to block 870 after selecting a FIFO handoff or FSM handoff.

At block 870, the retimer circuitry 106 serializes the transmission data streams to generate a retimed data transmission. For example, the TX serializers 150 and 152 of FIG. 1 serialize the four transmission data streams selected by the multiplexer 148 (at block 840) to generate a single data stream. The method 800 proceeds to block 880.

At block 880, the retimer circuitry 106 transmits the retimed data stream. For example, the TX driver 126 of FIG. 1 transmits the single data stream generated by the multiplexer circuitry 122 of FIG. 1. The method 800 proceeds to end.

Although example methods are described with reference to the flowchart illustrated in FIG. 8, many other methods of retiming data transmissions may alternatively be used in accordance with this description. For example, the order of execution of the blocks may be changed, and/or some of the blocks described may be changed, eliminated, or combined. Similarly, additional operations may be included in the process before, in between, or after the blocks shown in the illustrated examples.

Figure 9:
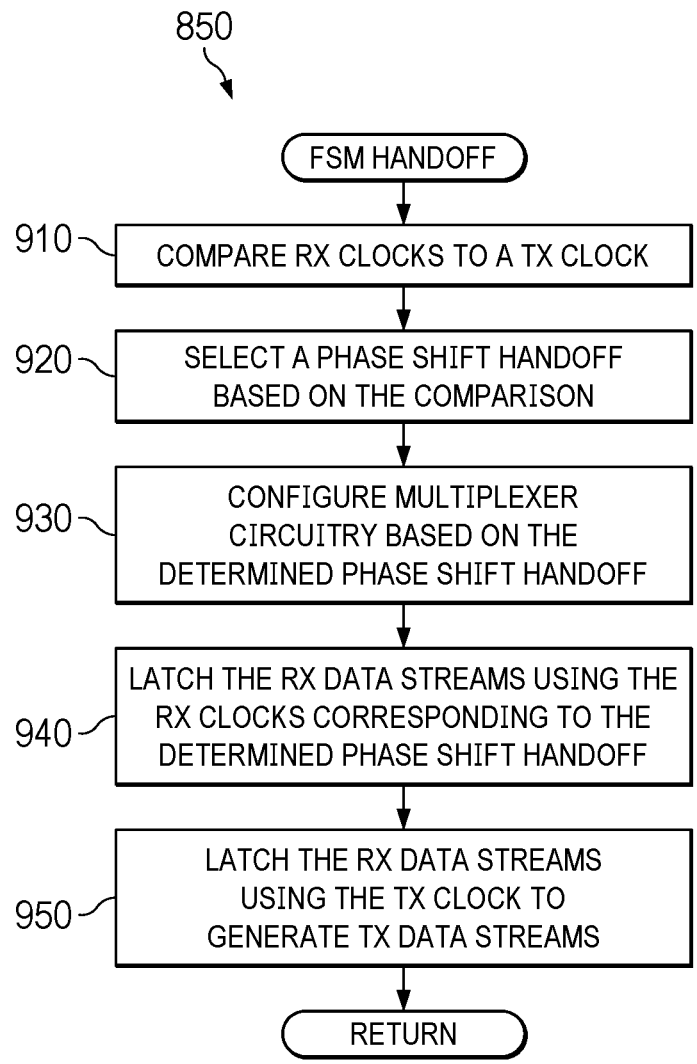
FIG. 9 is a flowchart representative of an example method that may be performed using machine readable instructions that can be executed and/or hardware configured to implement the FSM handoff circuitry of FIGS. 1 and 2.

FIG. 9 is a flowchart representative of an example method 850 that may be performed using machine readable instructions that can be executed and/or hardware (e.g., logic circuitry, analog circuitry, a processor, a state machine, memory and/or a combination thereof) configured to implement the FSM handoff circuitry 120 of FIGS. 1 and 2. The method 850 begins at block 910. At block 910, the FSM handoff circuitry 120 compares receiver clocks to a transmission clock. For example, the comparison circuitry 242 of FIGS. 2 and 3A latches the divided transmission clock (CLK_TX_1) using each of the four receiver clocks (CLK_RX<3:0>) to generate the data output (DOUT<3:0>). The comparison of block 910 is illustrated in FIG. 3B above. The method 850 proceeds to block 920.

At block 920, the FSM handoff circuitry 120 selects a phase shift handoff based on the comparison at block 910. For example, the FSM 244 of FIG. 2 selects between a zero degree handoff, a ninety degree handoff, a one-hundred and eighty degree handoff, and a two-hundred degree handoff based on the data output from the comparison circuitry 242. The method 850 proceeds to block 930.

At block 930, the FSM handoff circuitry 120 configures multiplexer circuitry based on the determined phase shift handoff from block 920. For example, the FSM 244 configures the multiplexers 246 and 250 of FIG. 2 to couple one or more of the four receiver clocks to clock inputs (CLK) of the flip-flops 218-232 of FIG. 2 based on the phase shift handoff corresponding to the data output from the comparison circuitry 242. Examples of which of the four receiver clocks correspond to each of the phase shift handoffs are discussed in connection with FIG. 2, above. The method 850 proceeds to block 940.

At block 940, the FSM handoff circuitry 120 latches the receiver data streams using the receiver clock(s) corresponding to the determined phase shift handoff from block 920. For example, the flip-flops 218-224 latch outputs of the flip-flops 210-216 of FIG. 2 based on which of the four receiver clocks are coupled to the clock inputs by the first multiplexer 246. In such an example, the flip-flops 226-232 latch outputs of the flip-flops 218-224 based on which of the four receiver clocks are coupled to the clock inputs by the second multiplexer 250. The method 850 proceeds to block 950.

At block 950, the FSM handoff circuitry 120 latches the receiver data streams using the transmission clock to generate transmission data streams. For example, the flip-flops 234-240 of FIG. 2 latch outputs of the flip-flops 224-232 based on the divided transmission clock. The method 850 returns.

Although example methods are described with reference to the flowchart illustrated in FIG. 9, many other methods of retiming data transmissions using the FSM handoff circuitry 120 may alternatively be used in accordance with this description. For example, the order of execution of the blocks may be changed, and/or some of the blocks described may be changed, eliminated, or combined. Similarly, additional operations may be included in the process before, in between, or after the blocks shown in the illustrated examples.

Figure 10:
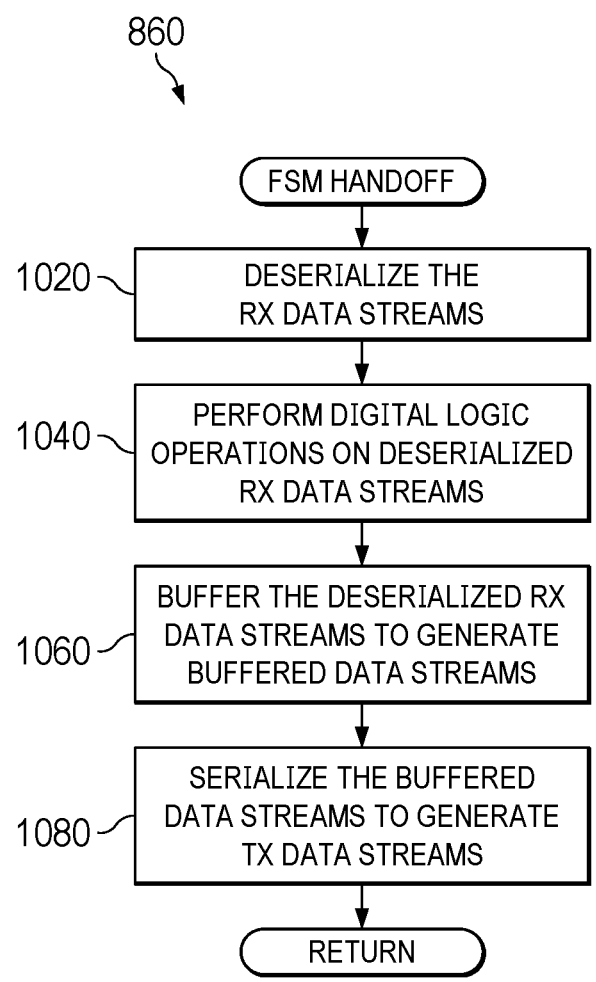
FIG. 10 is a flowchart representative of an example method that may be performed using machine readable instructions that can be executed and/or hardware configured to implement the FIFO handoff circuitry of FIG. 1.

FIG. 10 is a flowchart representative of an example method 860 that may be performed using machine readable instructions that can be executed and/or hardware (e.g., logic circuitry, analog circuitry, a processor, a state machine, memory and/or a combination thereof) configured to implement the FIFO handoff circuitry 118 of FIG. 1. The method 860 begins at block 1020. At block 1020, the deserializer 140 of FIG. 1 deserializes the plurality of RX data streams. For example, the deserializer 140 deserializes the four receiver data streams (DATA_RX<3:0>), from the interleaving circuitry 114 of FIG. 1, to supply the DSP 142 of FIG. 1 with thirty-two receiver data streams. The method 860 proceeds to block 1040.

At block 1040, the DSP 142 performs digital logic operations on the deserialized receiver data streams. For example, the DSP 142 may monitor the deserialized receiver data streams to determine a command to configure the DSP 142. The method 860 proceeds to block 1060.

At block 1060, the FIFO buffer 146 of FIG. 1 buffers the deserialized receiver data streams to generate TX data streams. For example, the FIFO buffer 146 accepts thirty-two data streams from the deserializer 140 and supplies an output of thirty-two data streams to the serializer circuitry 144 of FIG. 1. In such an example, the thirty-two data streams supplied to the FIFO buffer 146 are based on the receiver clock (CLK_RX<0>) and supplies the thirty-two data streams based on the divided transmission clock (CLK_TX_1). The method 860 proceeds to block 1080.

At block 1080, the serializer circuitry 144 serializes the buffered data streams to generate TX data streams. For example, the serializer circuitry 144 accepts thirty-two data streams from the FIFO buffer 146 and serializes the thirty-two data streams based on the divided transmission clock. The method of block 860 returns.

Although example methods are described with reference to the flowchart illustrated in FIG. 10, many other methods of retiming data transmissions using the FIFO handoff circuitry 118 may alternatively be used in accordance with this description. For example, the order of execution of the blocks may be changed, and/or some of the blocks described may be changed, eliminated, or combined. Similarly, additional operations may be included in the manufacturing process before, in between, or after the blocks shown in the illustrated examples.

Figure 11:
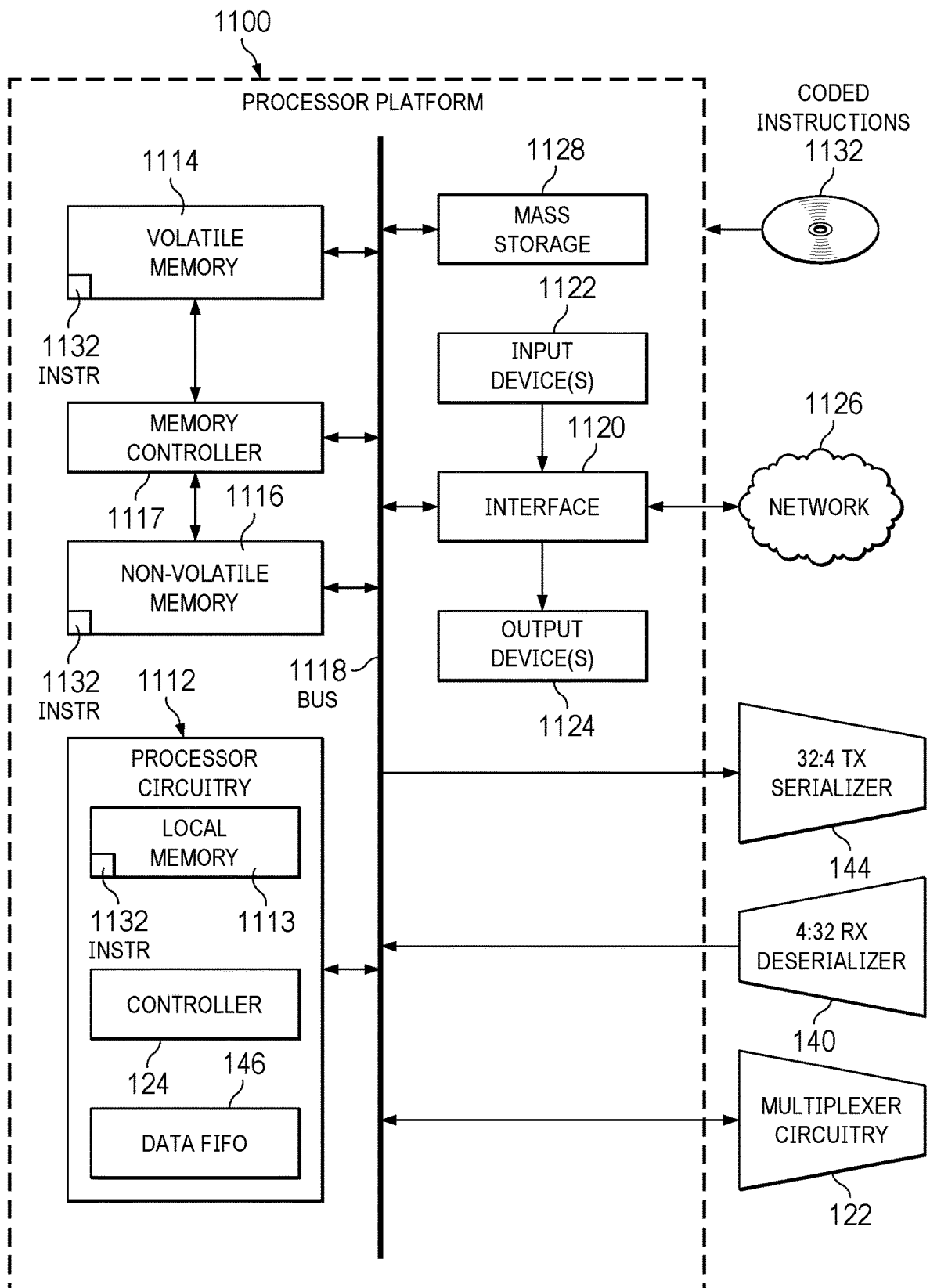
FIG. 11 is a block diagram of an example processing platform including processor circuitry structured to execute the example machine readable instructions and/or the example operations of FIGS. 8-10 to implement the retimer circuitry of FIG. 1.

FIG. 11 is a block diagram of an example processing platform including processor circuitry structured to execute the example machine readable instructions and/or the example operations of FIGS. 8-10 to implement the retimer circuitry of FIG. 1. The processor platform 1100 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 1100 of the illustrated example includes processor circuitry 1112. The processor circuitry 1112 of the illustrated example is hardware. For example, the processor circuitry 1112 can be implemented by one or more integrated circuits, logic circuits, FPGAs, microprocessors, CPUs, GPUs, DSPs, and/or microcontrollers from any desired family or manufacturer. The processor circuitry 1112 may be implemented by one or more semiconductor based (e.g., silicon based) devices. In this example, the processor circuitry 1112 implements the controller 124 of FIG. 1 and the FIFO buffer 146 of FIG. 1. Alternatively, the processor circuitry 1112 may be representative of the DSP 142 of FIG. 1. In such an implementation, the processor circuitry 1112 implements circuitry to generate the reset signal (RESET) of FIGS. 1 and 6 and to generate the clock gate enable signal (CLK_GATE_EN) of FIGS. 1, 6, and 7.

The processor circuitry 1112 of the illustrated example includes a local memory 1113 (e.g., a cache, registers, etc.). The processor circuitry 1112 of the illustrated example is in communication with a main memory including a volatile memory 1114 and a non-volatile memory 1116 by a bus 1118. The volatile memory 1114 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1116 may be implemented by flash memory and/or any other desired type of memory device. Access to the main memory 1114, 1116 of the illustrated example is controlled by a memory controller 1117.

The processor platform 1100 of the illustrated example also includes interface circuitry 1120. The interface circuitry 1120 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1122 are connected to the interface circuitry 1120. The input device(s) 1122 permit(s) a user to enter data and/or commands into the processor circuitry 1112. The input device(s) 1122 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1124 are also connected to the interface circuitry 1120 of the illustrated example. The output device(s) 1124 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1120 of the illustrated example, thus, typically includes a graphics driver card, a graphics driver chip, and/or graphics processor circuitry such as a GPU.

The interface circuitry 1120 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1126. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1100 of the illustrated example also includes one or more mass storage devices 1128 to store software and/or data. Examples of such mass storage devices 1128 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 1132, which may be implemented by the machine readable instructions of FIGS. 8-10, may be stored in the mass storage device 1128, in the volatile memory 1114, in the non-volatile memory 1116, and/or on a removable non-transitory computer readable storage medium such as a CD or DVD. In other examples, communication system 100 and/or retimer 106 may be coupled to processor platform 1100 either directly (e.g., via bus 1118 or interface 1120) or indirectly (e.g., via network 1126).

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An apparatus comprising:
 a received data input adapted to receive an input data stream;
 a data output adapted to output an output data stream;
 clock generation circuitry configured to generate a transmission clock at a transmission clock output and configured to generate a plurality of receiver clocks at a corresponding one of a plurality of receiver clock outputs, each of the plurality of receiver clocks having a different phase shift;
 interleaving circuitry including a data input, a plurality of data outputs, and a plurality of clock inputs, the data input coupled to the received data input and each of the plurality of clock inputs coupled to one of the plurality of receiver clock outputs; and
 handoff circuitry coupled to the interleaving circuitry, the handoff circuitry including:
  comparison circuitry coupled to the clock generation circuitry and configured to compare the plurality of receiver clocks to the transmission clock;
  clock configuration circuitry coupled to the comparison circuitry and configured to select one of the plurality of receiver clocks based on the comparison circuitry; and
  a plurality of flip-flops coupled to the clock configuration circuitry and configured to convert the plurality of data outputs from the plurality of receiver clocks to the transmission clock to generate a plurality of transmission data streams based on the one of the plurality of receiver clocks selected by the clock configuration circuitry.

2. The apparatus of claim 1, wherein the clock generation circuitry includes:
 clock gate and reset circuitry configured to generate a gated clock signal at a gated clock output;
 a current mode logic (CML) driver coupled to the gated clock output and configured to convert the gated clock signal to a CML clock signal at a CML output;
 a CML to complementary metal-oxide semiconductor (CMOS) converter coupled to the CML output and configured to convert the CML clock signal to generate the transmission clock at a transmission clock output; and
 a clock divider coupled to the transmission clock output and configured to divide the transmission clock to generate a divided transmission clock.

3. The apparatus of claim 2, wherein the clock gate and reset circuitry generates a clock gate enable signal to deterministically set a latency of the transmission clock.

4. The apparatus of claim 1, wherein the handoff circuitry is first handoff circuitry, the apparatus further including second handoff circuitry including:
- deserializer circuitry coupled to the plurality of data outputs and configured to deserialize the plurality of data outputs to generate a plurality of receiver data streams at a plurality of receiver data stream outputs;
- a buffer coupled to each of the plurality of receiver data stream outputs and configured to convert the receiver data streams to a plurality of buffered data streams at a plurality of buffered data stream outputs; and
- serializer circuitry coupled to each of the plurality of buffered data stream outputs and configured to serialize the buffered data streams to generate the transmission data streams.

5. The apparatus of claim 1, wherein the comparison circuitry generates a data output, the data output to determine a phase handoff between the transmission clock and a zero degrees phase shift included in the plurality of receiver clocks.

6. The apparatus of claim 1, wherein the clock configuration circuitry is a finite state machine (FSM) that couples one of the plurality of receiver clock outputs to the plurality of flip-flops based on the comparison circuitry.

7. The apparatus of claim 6, wherein the FSM configures the plurality of flip-flops to latch the plurality of data outputs at a first time based on the comparison of the plurality of receiver clocks to the transmission clock and a second time based on the transmission clock to generate the plurality of transmission data streams.

8. A device comprising:
- clock generation circuitry configured to generate a plurality of receiver clocks, a divided transmission clock, and a transmission clock;
- interleaving circuitry coupled to the clock generation circuitry and configured to generate a plurality of receiver data streams based on a receiver input and the plurality of receiver clocks;
- first handoff circuitry coupled to the clock generation circuitry and the interleaving circuitry and configured to convert the plurality of receiver data streams to a first plurality of transmission data streams based on the transmission clock and a buffer;
- second handoff circuitry coupled to the clock generation circuitry and the interleaving circuitry and configured to convert the plurality of receiver data streams to a second plurality of transmission data streams based on a comparison of the plurality of receiver clocks to the divided transmission clock; and
- serializer circuitry selectively coupled to the first handoff circuitry and the second handoff circuitry and configured to generate a transmission data stream based on the transmission clock and the first plurality of transmission data streams or the second plurality of transmission data streams.

9. The device of claim 8, wherein the clock generation circuitry includes:
- clock gate and reset circuitry coupled to the first handoff circuitry and configured to generate a gated clock signal;
- a current mode logic (CML) driver coupled to the clock gate and reset circuitry and configured to convert the gated clock signal to a CML clock signal;
- a CML to complementary metal-oxide semiconductor (CMOS) converter coupled to the clock gate and reset circuitry, the CML driver, and the serializer circuitry and configured to convert the CML clock signal to generate the transmission clock; and
- a clock divider coupled to first handoff circuitry, the second handoff circuitry, the serializer circuitry, and the CML to CMOS converter and configured to divide the transmission clock to generate the divided transmission clock.

10. The device of claim 9, wherein the clock gate and reset circuitry generates a clock gate enable signal to deterministically set a latency of the transmission clock.

11. The device of claim 8, wherein serializer circuitry is a first serializer circuitry, the first handoff circuitry further including:
- deserializer circuitry coupled to the interleaving circuitry and the clock generation circuitry and configured to deserialize the plurality of receiver data streams to generate a plurality of data streams;
- the buffer coupled to the deserializer circuitry and configured to convert the plurality of data streams to a plurality of transmission data streams; and
- second serializer circuitry coupled to the clock generation circuitry, the first serializer circuitry, and the buffer and configured to serialize the plurality of transmission data streams to generate the first plurality of transmission data streams.

12. The device of claim 11, wherein the buffer is a first in first out (FIFO) buffer configured to generate the transmission data streams using the transmission clock.

13. The device of claim 8, wherein the second handoff circuitry includes:
- comparison circuitry coupled to the clock generation circuitry and configured to compare the plurality of receiver clocks to the divided transmission clock;
- a finite state machine (FSM) coupled to the comparison circuitry and configured to select one of the plurality of receiver clocks based on the comparison of the comparison circuitry; and
- a plurality of flip-flops coupled to the clock generation circuitry and the interleaving circuitry and configured to convert the plurality of receiver data streams from the plurality of receiver clocks to the divided transmission clock to generate the second plurality of transmission data streams.

14. The device of claim 13, wherein the comparison circuitry generates an output to determine a phase handoff between the transmission clock and a zero degrees phase shift included in the plurality of receiver clocks.

15. The device of claim 13, wherein the FSM configures the plurality of flip-flops to latch the receiver data streams at a first time based on the comparison of the plurality of receiver clocks to the transmission clock and a second time based on the transmission clock to generate the plurality of transmission data streams.

16. A method comprising:
- interleaving, by interleaving circuitry, a receiver input based on receiver clock signals of different phases to generate a plurality of receiver data streams;
- comparing, by comparison circuitry, the receiver clock signals to a transmission clock;
- selecting, by a finite state machine, a phase shift handoff based on the comparison;
- configuring, by the finite state machine, multiplexer circuitry to latch the plurality of receiver data streams based on the phase shift handoff;

latching, by a first plurality of flip-flops, the plurality of receiver data streams based on a first clock corresponding to the phase shift handoff to generate latched receiver data streams;

latching, by a second plurality of flip-flops, the latched receiver data streams based on a second clock corresponding to the phase shift handoff to generate phase shifted data streams; and latching, by a third plurality of flip-flops, the phase shifted data streams based on the transmission clock to generate transmission data streams.

17. The method of claim 16, further including generating the receiver clock signals and the transmission clock based on a clock generator.

18. The method of claim 16, further including determining which of the receiver clock signals is closest to the transmission clock.

19. The method of claim 16, further including initializing clock generation circuitry to deterministically handoff the receiver input to the transmission data streams.

20. The method of claim 16, further including serializing the transmission data streams to generate transmission data stream.

* * * * *